US011017985B2

(12) United States Patent
Koshimizu et al.

(10) Patent No.: US 11,017,985 B2
(45) Date of Patent: May 25, 2021

(54) PLASMA PROCESSING APPARATUS, IMPEDANCE MATCHING METHOD, AND PLASMA PROCESSING METHOD

(71) Applicant: TOKYO ELECTRON LIMITED, Tokyo (JP)

(72) Inventors: Chishio Koshimizu, Miyagi (JP); Takashi Dokan, Miyagi (JP); Shinji Kubota, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/719,344

(22) Filed: Dec. 18, 2019

(65) Prior Publication Data
US 2020/0203129 A1    Jun. 25, 2020

(30) Foreign Application Priority Data

Dec. 19, 2018 (JP) .............................. JP2018-237154
Nov. 15, 2019 (JP) .............................. JP2019-207063

(51) Int. Cl.
*H01J 37/32* (2006.01)
*H01L 21/311* (2006.01)
*H01L 21/67* (2006.01)

(52) U.S. Cl.
CPC .. *H01J 37/32183* (2013.01); *H01J 37/32091* (2013.01); *H01J 37/32568* (2013.01); *H01L 21/31116* (2013.01); *H01L 21/67069* (2013.01); *H01J 2237/334* (2013.01)

(58) Field of Classification Search
CPC ......... H01L 21/31116; H01L 21/67069; H01L 21/67109; H01L 21/32137; H01L 21/67103; H01L 21/6831; H01L 21/31138; H01L 43/12; H01J 37/32183; H01J 37/32568; H01J 37/32091; H01J 2237/334
See application file for complete search history.

(56) References Cited

FOREIGN PATENT DOCUMENTS

JP    2016-096342 A    5/2016

*Primary Examiner* — Yuechuan Yu
(74) *Attorney, Agent, or Firm* — Rothwell, Figg, Ernst & Manbeck, P.C.

(57) ABSTRACT

In a plasma processing apparatus according to an embodiment, a first radio-frequency power supply is connected to a lower electrode of a substrate support provided within a chamber via a first matcher. The first radio-frequency power supply supplies first radio-frequency power for bias to the lower electrode. The second radio-frequency power supply is connected to a load via a second matcher. The second radio-frequency power supply supplies second radio-frequency power for plasma generation. A controller of the second matcher sets an impedance of a matching circuit of the second matcher such that a reflection from the load of the second radio-frequency power supply is reduced in a designated partial period within each cycle of the first radio-frequency power.

16 Claims, 20 Drawing Sheets

PLASMA PROCESSING APPARATUS, IMPEDANCE MATCHING METHOD, AND PLASMA PROCESSING METHOD

CROSS-REFERENCE TO RELATED APPLICATIONS

This application is based on and claims priority from Japanese Patent Application Nos. 2018-237154 and 2019-207063, filed on Dec. 19, 2018 and Nov. 15, 2019, respectively, with the Japan Patent Office, the disclosures of which are incorporated herein in their entireties by reference.

TECHNICAL FIELD

Embodiments of the present disclosure relate to a plasma processing apparatus, an impedance matching method, and a plasma processing method.

BACKGROUND

A plasma processing apparatus is used in the manufacture of electronic devices. The plasma processing apparatus includes a chamber, a substrate support, a first radio-frequency power supply, a first matcher, a second radio-frequency power supply, and a second matcher. The substrate support has a lower electrode and is provided within the chamber. The first radio-frequency power supply supplies first radio-frequency power to the lower electrode via the first matcher. The first matcher has a matching circuit configured to match the impedance on the load side of the first radio-frequency power supply with the output impedance of the first radio-frequency power supply. The first radio-frequency power is bias radio-frequency power. The second radio-frequency power supply supplies second radio-frequency power for plasma generation via the second matcher. The second matcher has a matching circuit configured to match the impedance on the load side of the second radio-frequency power supply with the output impedance of the second radio-frequency power supply. Such a plasma processing apparatus is described in, for example, Japanese Patent Laid-Open Publication No. 2016-096342.

SUMMARY

In an embodiment, a plasma processing apparatus is provided. The plasma processing apparatus includes a chamber, a substrate support, a first radio-frequency power supply, a first matcher, a second radio-frequency power supply, and a second matcher. The substrate support has a lower electrode and is provided within the chamber. The first radio-frequency power supply is configured to supply first radio-frequency power to the lower electrode. The first radio-frequency power is bias radio-frequency power. The first matcher is connected between the first radio-frequency power supply and the load of the first radio-frequency power supply. The second radio-frequency power supply is configured to supply second radio-frequency power for plasma generation. The second matcher is connected between the second radio-frequency power supply and the load of the second radio-frequency power supply. The second matcher has a matching circuit and a controller. The matching circuit has a variable impedance. The controller is configured to set an impedance of the matching circuit such that a reflection from the load of the second radio-frequency power supply is reduced in a partial period designated within each cycle of the first radio-frequency power.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
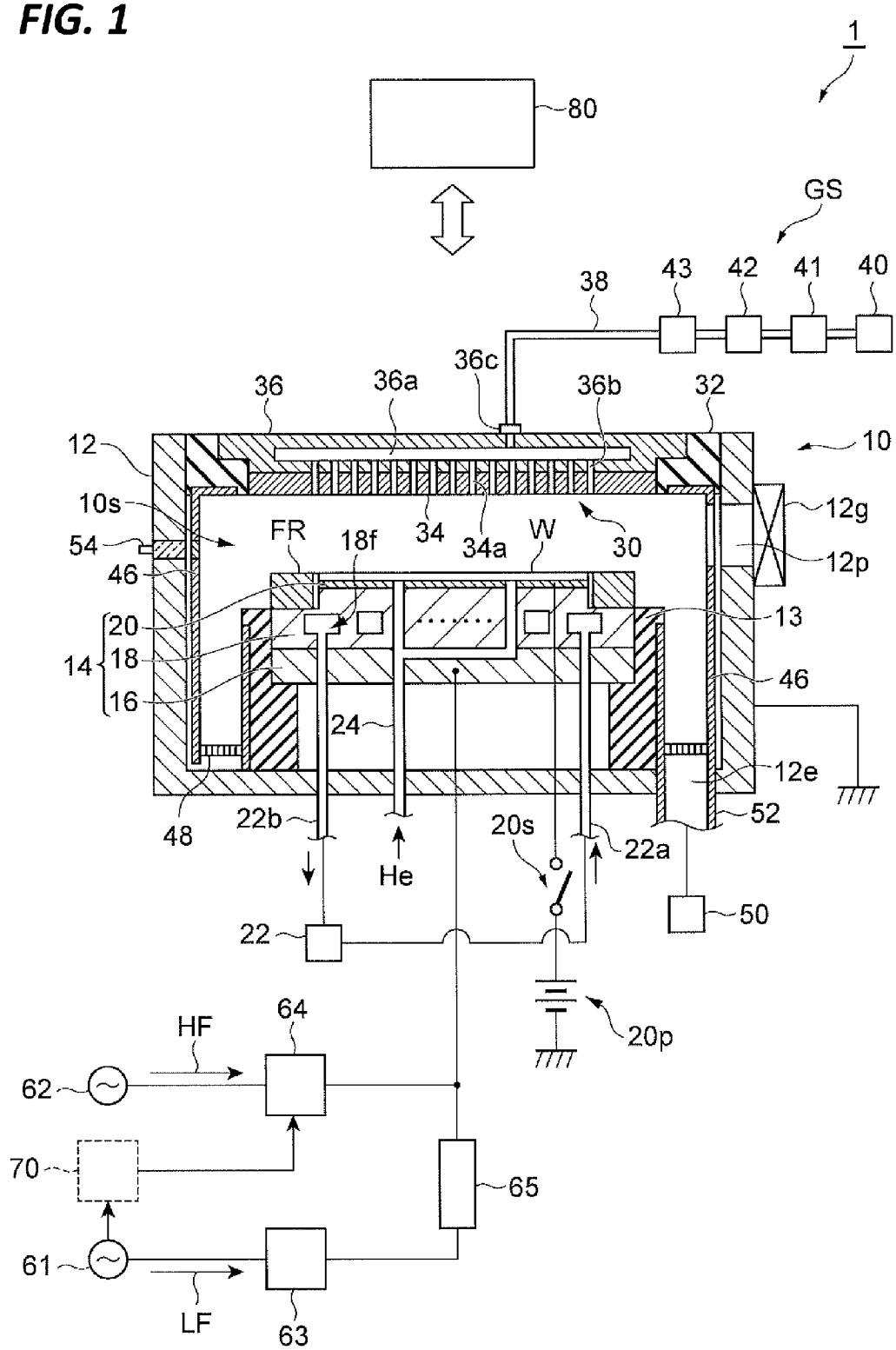
FIG. 1 is a view schematically illustrating a plasma processing apparatus according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, various embodiments will be described.

In an embodiment, a plasma processing apparatus is provided. The plasma processing apparatus includes a chamber, a substrate support, a first radio-frequency power supply, a first matcher, a second radio-frequency power supply, and a second matcher. The substrate support has a lower electrode and is provided within the chamber. The first radio-frequency power supply is configured to supply first radio-frequency power to the lower electrode. The first radio-frequency power is bias radio-frequency power. The first matcher is connected between the first radio-frequency power supply and the load of the first radio-frequency power supply. The second radio-frequency power supply is configured to supply second radio-frequency power for plasma generation. The second matcher is connected between the second radio-frequency power supply and the load of the second radio-frequency power supply. The second matcher has a matching circuit and a controller. The matching circuit has a variable impedance. The controller is configured to set the impedance of the matching circuit such that a reflection from the load of the second radio-frequency power supply is reduced in a designated partial period within each cycle of the first radio-frequency power.

In a period in which the voltage of the first radio-frequency power output from the first radio-frequency power supply has a positive polarity, the potential difference between the substrate and the plasma is small and the sheath is thin. Accordingly, in the period in which the voltage of the first radio-frequency power output from the first radio-frequency power supply has a positive polarity, the energy of the ions supplied from the plasma to the substrate is low. Meanwhile, in the period in which the voltage of the first radio-frequency power output from the first radio-frequency power supply has a negative polarity, the potential difference between the substrate and the plasma is large and the sheath is thick. Accordingly, in the period in which the voltage of the first radio-frequency power output from the first radio-frequency power supply has a negative polarity, the energy of the ions supplied from the plasma to the substrate is radio. In an embodiment, the reflection is reduced in the partial period in each cycle of the first radio-frequency power, and thus the plasma generation efficiency is increased. Meanwhile, in a period other than the partial period within each cycle of the first radio-frequency power, the reflection of the second radio-frequency power is increased, and the plasma generation efficiency is decreased. Therefore, in this embodiment, by designating the partial period within each cycle of the first radio-frequency power, ions having desired ion energy are efficiently generated and supplied to the substrate.

In an embodiment, the plasma processing apparatus may further include a sensor. The sensor is configured to measure a voltage and a current in an electrical path between the matching circuit and the second radio-frequency power supply. The controller determines the impedance on the load side of the second radio-frequency power supply in the partial period from the voltage and the current acquired by the sensor. The controller is configured to set the impedance of the matching circuit such that a difference between the determined impedance and the output impedance of the second radio-frequency power supply is reduced.

In another embodiment, an impedance matching method executed in a plasma processing apparatus is provided. The matching method includes a step of supplying first radio-frequency power, which is bias radio-frequency power, from a first radio-frequency power supply to a lower electrode of a support provided in a chamber of the plasma processing apparatus via a first matcher. The matching method further includes a step of supplying a second radio-frequency power for plasma generation from a second radio-frequency power supply via a second matcher. The matching method further includes a step of setting an impedance of a matching circuit of the second matcher such that a reflection from a load of the second radio-frequency power supply is reduced in a partial period designated within each cycle of the first radio-frequency power.

In an embodiment, the impedance on the load side of the second radio-frequency power supply in the partial period is determined from a voltage and a current in the electrical path between the matching circuit and the second radio-frequency power supply. The voltage and the current are acquired by the sensor. The impedance of the matching circuit is set such that a difference between the determined impedance and the output impedance of the second radio-frequency power supply is reduced.

In an embodiment, the partial period may be a period within a period in which a voltage of the first radio-frequency power output from the first radio-frequency power supply has a negative polarity. According to this embodiment, ions having radio energy are efficiently generated and supplied to the substrate.

In an embodiment, the partial period may be a period within a period in which a voltage of the first radio-frequency power output from the first radio-frequency power supply has a positive polarity. According to this embodiment, ions having low energy are efficiently generated and supplied to the substrate.

In still another embodiment, an impedance matching method executed in a plasma processing apparatus is provided. The plasma processing method includes a step of executing a first plasma processing in a chamber of the plasma processing apparatus in a first period. The plasma processing method further includes a step of executing a second plasma processing in the chamber in a second period after the first period or following the first period. Each of the step of executing the first plasma processing and the step of executing the second plasma processing includes a step of supplying first radio-frequency power, which is bias radio-frequency power, from a first radio-frequency power supply to a lower electrode of a support provided in the chamber via a first matcher. Each of the step of executing the first plasma processing and the step of executing the second plasma processing further includes a step of supplying second radio-frequency power for plasma generation from a second radio-frequency power supply via a second matcher. Each of the step of executing the first plasma processing and the step of executing the second plasma processing further includes a step of setting the impedance of the matching circuit of the second matcher. The impedance of the matching circuit of the second matcher is set such that a reflection from the load of the second radio-frequency power supply is reduced in a partial period designated within each cycle of the first radio-frequency power. In one of the step of executing the first plasma processing and the step of executing the second plasma processing, the partial period is a period within a period in which the voltage of the first radio-frequency power output from the first radio-frequency power supply has a negative polarity. In the other one of the step of executing the first plasma processing and the step of executing the second plasma processing, the partial period is a period within a period in which the voltage of the first radio-frequency power output from the first radio-frequency power supply has a positive polarity.

In the step of executing the first plasma processing, the partial period may be a period within a period in which the voltage of the first radio-frequency power output from the first radio-frequency power supply has a negative polarity. In this case, in the step of executing the second plasma processing, the partial period may be a period within a period in which the voltage of the first radio-frequency power output from the first radio-frequency power supply has a positive polarity.

In the step of executing the first plasma processing, the partial period may be a period within a period in which the voltage of the first radio-frequency power output from the first radio-frequency power supply has a positive polarity. In this case, in the step of executing the second plasma processing, the partial period may be a period within a period in which the voltage of the first radio-frequency power output from the first radio-frequency power supply has a negative polarity.

In an embodiment, the substrate may be disposed within the chamber over the first period and the second period. The substrate may have a base area and a film provided on the base area. In the step of executing the first plasma processing, the film may be etched using plasma of a processing gas such that the base area is exposed. In the step of executing the second plasma processing, the film may be further etched using the plasma of the processing gas.

In an embodiment, the substrate may be disposed within the chamber over the first period and the second period. The substrate may have a first film and a second film. The first film may be provided on the second film. In the step of executing the first plasma processing, the first film may be etched using the plasma of the processing gas. In the step of executing the second plasma processing, the second film may be etched using the plasma of the processing gas.

In an embodiment, the substrate may be disposed within the chamber in the first period. In the step of executing the first plasma processing, the film of the substrate may be etched using the plasma of the processing gas. The substrate may not be disposed within the chamber in the second period. Deposit attached to an inner wall surface of the chamber is removed using the plasma of the processing gas in the executing the second plasma processing.

In an embodiment, the substrate may be disposed within the chamber over the first period and the second period. In the step of executing the first plasma processing, the film of the substrate may be etched using the plasma of the processing gas so as to provide a sidewall surface. In the executing the second plasma processing, deposit including chemical species from the plasma of the processing gas or chemical species from plasma of a separate processing gas may be formed on the surface of the substrate on which the film is etched in the executing the first plasma processing, and the step of executing the first plasma processing and the step of executing the second plasma processing may be alternately repeated.

In an embodiment, the substrate may be disposed within the chamber over the first period and the second period. In the step of executing the first plasma processing, the film of the substrate may be etched using the plasma of the processing gas so as to provide a sidewall surface. In the step of executing the second plasma processing, the surface of the film etched in the executing the first plasma processing may be modified using the plasma of the processing gas or plasma of a separate processing gas, and the step of executing the first plasma processing and the step of executing the second plasma processing may be alternately repeated.

Hereinafter, various embodiments will be described in detail with reference to the drawings. In each drawing, the same or corresponding components will be denoted by the same reference numerals.

FIG. 1 is a view schematically illustrating a plasma processing apparatus according to an embodiment. The plasma processing apparatus 1 illustrated in FIG. 1 is a capacitively coupled plasma processing apparatus. The plasma processing apparatus 1 includes a chamber 10. The chamber 10 provides an internal space 10s therein.

The chamber 10 includes a chamber body 12. The chamber main body 12 has a substantially cylindrical shape. The inner space 10s of the chamber 10 is provided inside the chamber body 12. The chamber body 12 is made of, for example, aluminum. On the inner wall surface of the chamber body 12, a corrosion-resistant film is provided. The corrosion-resistant film may be a film formed of ceramic such as, for example, aluminum oxide or yttrium oxide.

A passage 12p is formed in the side wall of the chamber body 12. A substrate W passes through the passage 12p when the substrate W is transported between the inner space 10s and the outside of the chamber 10. The passage 12p is configured to be capable of being opened/closed by a gate valve 12g. The gate valve 12g is provided along the side wall of the chamber body 12.

A support unit 13 is provided on the bottom portion of the chamber body 12. The support unit 13 is formed of an insulating material. The support unit 13 has a substantially cylindrical shape. The support unit 13 extends upward from the bottom portion of the chamber body 12 within the internal space 10s. The support unit 13 supports a substrate support, that is, a support 14. The support 14 is provided in the inner space 10s. The support 14 is configured to support a substrate W within the chamber 10, i.e. within the inner space 10s.

The support 14 has a lower electrode 18 and an electrostatic chuck 20. The support 14 may further include an electrode plate 16. The electrode plate 16 is formed of a conductor such as, for example, aluminum, and has a substantially disk shape. The lower electrode 18 is provided on the electrode plate 16. The lower electrode 18 is made of a conductor such as, for example, aluminum, and has a substantially disk shape. The lower electrode 18 is electrically connected to the electrode plate 16.

The electrostatic chuck 20 is provided on the lower electrode 18. A substrate W is placed on the upper surface of the electrostatic chuck 20. The electrostatic chuck 20 has a main body and an electrode. The main body of the electrostatic chuck 20 has a substantially disk shape, and is formed of a dielectric material. The electrode of the electrostatic chuck 20 is a film-shaped electrode, and is provided in the main body of the electrostatic chuck 20. The electrode of the electrostatic chuck 20 is connected to a direct current (DC) power supply 22 via a switch 20s. When a voltage from the DC power supply 22 is applied to the electrode of the electrostatic chuck 20, an electrostatic attractive force is generated between the electrostatic chuck 20 and the substrate W. Due to the generated electrostatic attractive force, the substrate W is attracted to the electrostatic chuck 20, and held by the electrostatic chuck 20.

The support 14 supports a focus ring FR. The focus ring FR is disposed to surround the edge of the substrate W. The focus ring FR is provided in order to improve the in-plane uniformity of a plasma processing on the substrate W. The focus ring FR may be formed of, but not limited to, silicon, silicon carbide, or quartz.

Inside the lower electrode 18, a flow path 18f is provided. A heat exchange medium (coolant) is supplied to the flow path 18f from a chiller unit 22 provided outside the chamber 10 through a pipe 22a. The heat exchange medium supplied to the flow path 18f is returned to the chiller unit through a pipe 22b. In the plasma processing apparatus 1, the temperature of the substrate W disposed on the electrostatic chuck 20 is adjusted by heat exchange between the heat exchange medium and the lower electrode 18.

The plasma processing apparatus 1 is provided with a gas supply line 24. The gas supply line 24 supplies a heat transfer gas (e.g., He gas) from a heat transfer gas supply mechanism to a gap between the upper surface of the electrostatic chuck 20 and the rear surface of the wafer W.

The plasma processing apparatus 1 further includes an upper electrode 30. The upper electrode 30 is provided above the support 14. The upper electrode 30 is supported in the upper portion of the chamber body 12 via a member 32. The member 32 is formed of a material having an insulating property. The upper electrode 30 and the member 32 close the upper opening of the chamber body 12.

The upper electrode 30 may include an upper plate 34 and a support body 36. The lower surface of the upper plate 34 is the lower surface on the internal space 10s side, and defines the internal space 10s. The electrode plate 34 may be formed of a low-resistance conductor or semiconductor having little Joule heat. The upper plate 34 is provided with a plurality of gas ejection holes 34a. The plurality of gas ejection holes 34a penetrate the upper plate 34 in the thickness direction thereof.

The support body 36 detachably supports the upper plate 34. The support body 36 is made of a conductive material such as, for example, aluminum. A gas diffusion space 36a is provided inside the support body 36. A plurality of gas holes 36b are formed in the support body 36. The plurality of gas holes 36b extend downward from the gas diffusion chamber 36a. The plurality of gas holes 36b communicate with the plurality of gas ejection holes 34a, respectively. A gas inlet port 36c is formed in the support body 36. The gas inlet port 36c is connected to the gas diffusion chamber 36a. A gas supply pipe 38 is connected to the gas inlet 36c.

To the gas supply pipe 38, a gas source group 40 is connected via a valve group 41, a flow rate controller group 42, and a valve group 43. The gas source group 40, the valve group 41, the flow controller group 42, and the valve group 43 constitute a gas supply section GS. The gas source group 40 includes a plurality of gas sources. Each of the valve group 41 and the valve group 43 includes a plurality of opening/closing valves. The flow rate controller group 42 includes a plurality of gas sources. Each of the flow rate controllers of the flow rate controller group 42 is a mass flow controller or a pressure control-type flow rate controller. Each of the gas sources of the gas source group 40 is connected to the gas supply pipe 38 through a corresponding opening/closing valve in the valve group 41, a corresponding flow rate controller in the flow rate controller group 42, and a corresponding opening/closing valve in the valve group 43.

In the plasma processing apparatus 1, a shield 46 is detachably installed along the inner wall surface of the chamber body 12. The shield 46 is also provided on the outer periphery of the support unit 13. The shield 46 suppresses etching byproducts from adhering to the chamber body 12. The shield 46 is constituted by forming a corrosion-resistant film on the surface of a member formed of, for example, aluminum. The corrosion-resistant film may be a film formed of ceramic such as, for example, yttrium oxide.

A baffle plate 48 is provided between the support body 13 and the side wall of the chamber body 12. The baffle plate 48 is constituted by forming a corrosion-resistant film on the surface of a member formed of, for example, aluminum. The corrosion-resistant film may be a film formed of ceramic such as, for example, yttrium oxide. A plurality of through holes are formed in the baffle plate 48. An exhaust port 12e is provided below the baffle plate 48 and in the bottom portion of the chamber body 12. An exhaust apparatus 50 is connected to the exhaust port 12e via an exhaust pipe 52. The exhaust apparatus 50 includes a pressure regulation valve and a vacuum pump such as, for example, a turbo molecular pump.

In an embodiment, the substrate processing apparatus 1 may further include a light emission analyzer 54. The light emission analyzer 54 is provided outside the chamber 10. The light emission analyzer 54 receives light from plasma through an optically transparent window member provided within the chamber 10. The light emission analyzer 54 acquires the emission intensity of one or more wavelengths of plasma. A control unit 80 to be described later may terminate a step of a plasma processing method of various embodiments to be described later based on the light emission intensity acquired by the light emission analyzer 54.

In an embodiment, the plasma processing apparatus 1 further includes a first radio-frequency power supply 61. The first radio-frequency power supply 61 is configured to output first radio-frequency power, that is, radio-frequency power LF. The radio-frequency power is bias radio-frequency power. The radio-frequency power LF mainly has a frequency suitable for attracting ions into a substrate W. The frequency of the radio-frequency power LF is, for example, a frequency in the range of 400 kHz to 13.56 MHz. In an example, the frequency of the radio-frequency power LF is 400 kHz.

Figure 2:
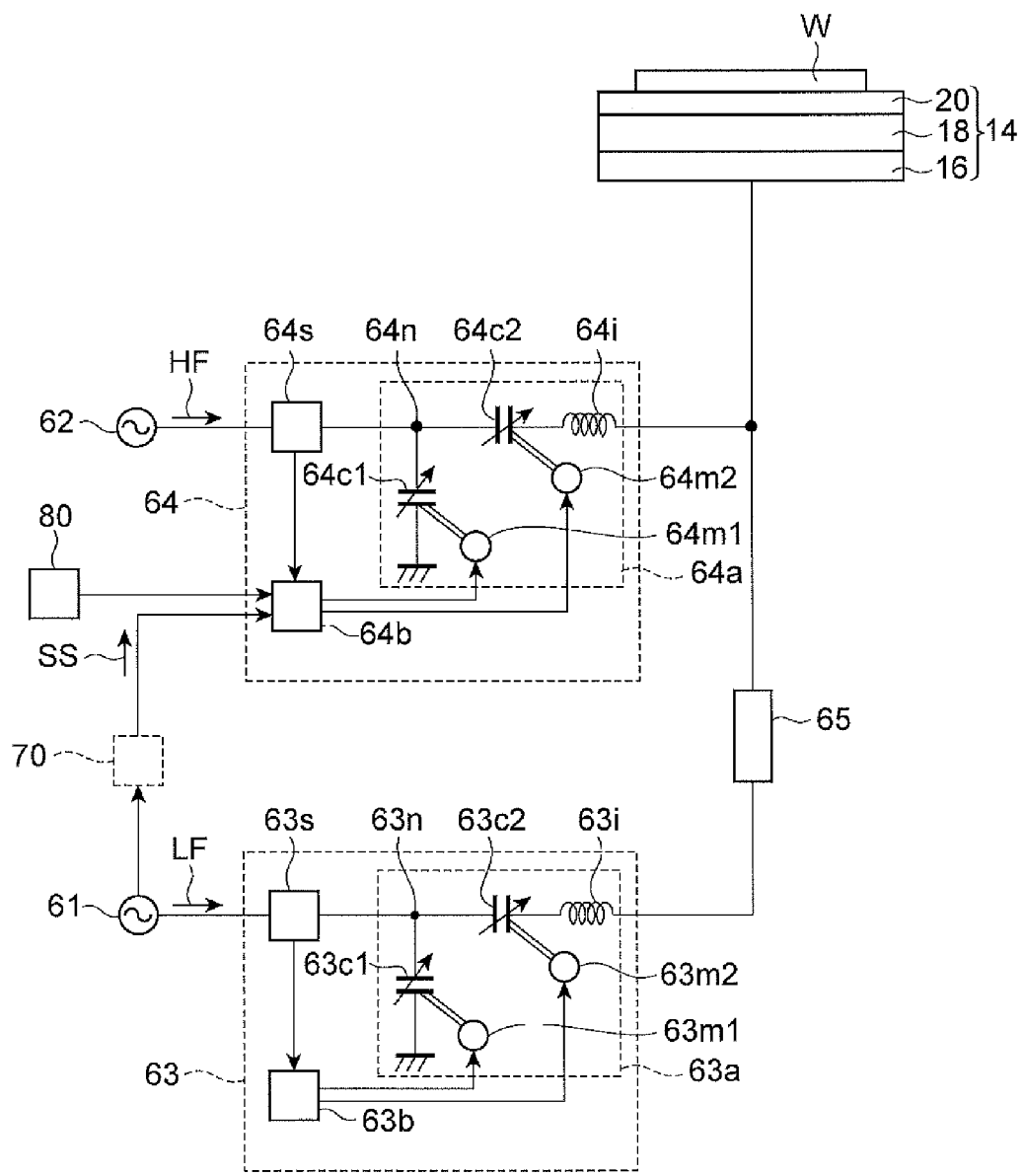
FIG. 2 is a view illustrating an exemplary configuration of a power supply system including two matchers of the plasma processing apparatus illustrated in FIG. 1.

The first power supply 61 is configured to supply radio-frequency power LF to the lower electrode 18. The first radio-frequency power supply 61 is electrically connected to the lower electrode 18 via a first matcher 63 and an electrode plate 65. FIG. 2 is a view illustrating an exemplary configuration of a power supply system including two matchers of the plasma processing apparatus illustrated in FIG. 1. As illustrated in FIG. 2, the first matcher 63 is connected between the first radio-frequency power supply 61 and the load of the first radio-frequency power supply 61. The first matcher 63 includes a matching circuit 63a. The first matcher 63 further includes a controller 63b and a sensor 63s.

The matching circuit 63a has a variable impedance. The impedance of the matching circuit 63a is set to reduce reflection from the load of the first radio-frequency power supply 61. For example, the impedance of the matching circuit 63a is set to match the impedance of the load side (lower electrode side) of the first radio-frequency power supply 61 with the output impedance of the first radio-frequency power supply 61.

In an embodiment, the matching circuit 63a has one or more variable reactance elements to provide a variable impedance. The matching circuit 63a may have a capacitor 63c1 and a capacitor 63c2 as one or more variable reactance elements. The matching circuit 63a may further include an inductor 63i. One end of the capacitor 63c1 is connected to a node 63n. The node 63n is provided in an electrical path between the first radio-frequency power supply 61 and the lower electrode 18. The other end of the capacitor 63c1 is connected to a ground. One end of the capacitor 63c2 is connected to the node 63n. The other end of the capacitor 63c2 is electrically connected to the lower electrode 18 via the inductor 63i.

In another embodiment, the matching circuit 63a may be configured by connecting a plurality of series circuits each including a fixed impedance element and a switching element in parallel in order to provide a variable impedance. The fixed impedance element is, for example, a fixed capacitance capacitor.

The controller 63b is configured to set the impedance of the matching circuit 63a such that the reflection from the load of the first radio-frequency power supply 61 is reduced. The controller 63b is configured with, for example, a processor.

In an embodiment, the controller 63b is configured to acquire an impedance $Z_1$ on the load side of the first radio-frequency power supply 61. The controller 63b sets the impedance of the matching circuit 63a so as to reduce the difference between the acquired impedance $Z_1$ and the output impedance of the first radio-frequency power supply 61. In another embodiment, the controller 63b is configured to acquire the power of a reflected wave from the load of the first radio-frequency power supply 61. The controller 63b sets the impedance of the matching circuit 63a so as to reduce the power of the acquired reflected wave.

In an embodiment, the controller 63b sets the reactance of each of the one or more variable reactance elements described above of the matching circuit 63a in order to set the impedance of the matching circuit 63a. In an example, each of the capacitor 63c1 and the capacitor 63c2 is a mechanical variable capacitance capacitor. The capacitance of the capacitor 63c1 is adjusted by a motor 63m1. The capacitance of the capacitor 63c2 is adjusted by a motor 63m2. The controller 63b is configured to control the motor 63m1 and the motor 63m2 in order to set the capacitance of the capacitor 63c1 and the capacitance of the capacitor 63c1. In another embodiment, the controller 63b sets the conductive state of the switching element of each of the above-described plurality of serial circuits of the matching circuit 63a in order to set the impedance of the matching circuit 63a.

In an embodiment, the sensor 63s is configured to measure the voltage on the electrical path between the first radio-frequency power supply 61 and the matching circuit 63a and the current flowing on the electrical path. The controller 63b is configured to specify the impedance $Z_1$ from the voltage and current measured by the sensor 63s.

The impedance $Z_1$ is obtained by, for example, $V_1/I_1$. $V_1$ and $I_1$ may be a voltage and a current acquired by the sensor 63s. $V_1$ and $I_1$ may be an average value of the voltage and an average of the current acquired by the sensor 63s. Each of the average value of the voltage and the average value of the current may be generated by a sample hold circuit provided between the controller 63b and the sensor 63s. Alternatively, the average value of the voltage may be generated when the controller 63b performs an averaging processing with respect to the voltage acquired by the sensor 63s. Alternatively, the average value of the current may be generated when the controller 63b performs an averaging processing with respect to the current obtained by the sensor 63s. Further, the time length of a period in which each of the voltage and current to be averaged is acquired by the sensor 63s may be a predetermined time length.

In another embodiment, the sensor 63s may be configured to obtain a parameter that reflects the power of the reflected wave from the load of the first radio-frequency power supply 61. The controller 63b sets the impedance of the matching circuit 63a so as to reduce the power of the reflected wave depending on the parameter obtained by the sensor 63s.

The plasma processing apparatus 1 further includes a second radio-frequency power supply 62. The second radio-frequency power supply 62 is configured to output second radio-frequency power, that is, radio-frequency power HF. The radio-frequency power is radio-frequency power for plasma generation. The frequency of the radio-frequency power HF is lower than the frequency of the radio-frequency power LF. The frequency of the radio-frequency power HF is, for example, a frequency in the range of 27 MHz to 100 MHz. In an example, the frequency of the radio-frequency power HF is 40.86 MHz.

The second radio-frequency power supply 62 is electrically connected to the lower electrode 18 via a second matcher 64. In another embodiment, the second radio-frequency power supply 62 may be connected to the upper electrode 30 via the second matcher 64. The second matcher 64 includes a matching circuit 64a. The second matcher 64 further includes a controller 64b and a sensor 64s. The controller 64b is configured with, for example, a processor.

The matching circuit 64a has a variable impedance. The impedance of the matching circuit 64a is set to reduce reflection from the load of the second radio-frequency power supply 62. For example, the impedance of the matching circuit 64a is set to match the impedance of the load side (lower electrode side) of the second radio-frequency power supply 62 with the output impedance of the second radio-frequency power supply 62.

In an embodiment, the matching circuit 64a has one or more variable reactance elements to provide a variable impedance. The matching circuit 64a may have a capacitor 64c1 and a capacitor 64c2 as one or more variable reactance elements. The matching circuit 64a may further include an inductor 64i. One end of the capacitor 64c1 is connected to a node 64n. The node 64n is provided on an electrical path between the first radio-frequency power supply 62 and the lower electrode 18. The other end of the capacitor 64c1 is connected to a ground. One end of the capacitor 64c2 is connected to a node 64n. The other end of the capacitor 64c2 is electrically connected to the lower electrode 18 via the inductor 64i.

In another embodiment, the matching circuit 64a may be configured by connecting a plurality of series circuits each including a fixed impedance element and a switching element in parallel in order to provide a variable impedance. The fixed impedance element is, for example, a fixed capacitance capacitor.

Figure 3:
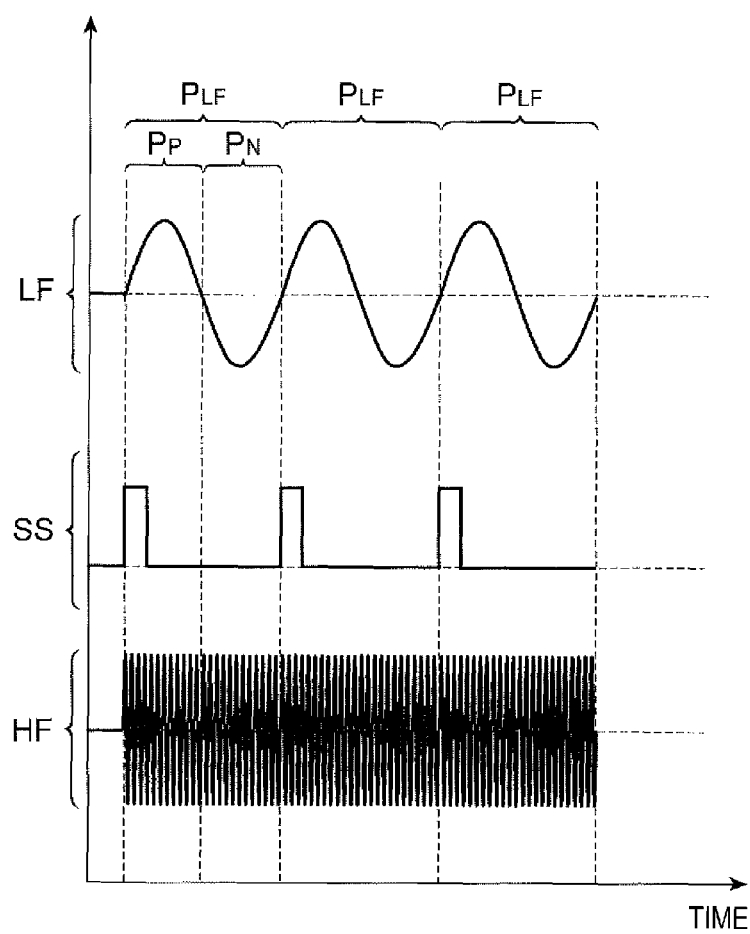
FIG. 3 is an exemplary timing chart regarding radio-frequency power LF, radio-frequency power HF, and a synchronization signal SS.

Hereinafter, reference is made to FIG. 3 together with FIGS. 1 and 2. FIG. 3 is an exemplary timing chart regarding radio-frequency power LF, radio-frequency power HF, and a synchronization signal SS. The controller 64*b* is configured to set the impedance of the matching circuit 64*a* such that a reflection from the load of the second radio-frequency power supply 62 is reduced in a designated partial period $P_M$ (see FIG. 5) in each cycle $P_{LF}$ of the radio-frequency power LF. Hereinafter, an example in which one partial period $P_M$ is set within each cycle $P_{LF}$ will be described, but two or more partial periods $P_M$ may be set within each cycle $P_{LF}$.

When the partial period $P_M$ is a partial period within each cycle $P_{LF}$, its start time and time length are not limited. The start time and time length of the partial period $P_M$ may be arbitrarily set by designation from the control unit 80 to be described later.

Each cycle $P_{LF}$ includes a period $P_P$ and a period $P_N$. The period $P_P$ is a period in which the voltage of the radio-frequency power HF output from the first radio-frequency power supply 61 has a positive polarity. The period $P_N$ is a period in which the voltage of the radio-frequency power HF output from the first radio-frequency power supply 61 has a negative polarity. In an embodiment, the partial period $P_M$ is a period within the period $P_N$. In an embodiment, the partial period $P_M$ is a period within the period $P_P$.

In an embodiment, the controller 64*b* specifies the partial period $P_M$ using a synchronization signal SS. In an example, the synchronization signal SS may be a signal having a synchronization pulse at the start time of each cycle $P_{LF}$ of the radio-frequency power LF, as shown in FIG. 3. The synchronization signal SS may be generated by the first radio-frequency power supply 61 and given to the controller 64*b*. The synchronization signal SS may be generated by the synchronization signal generator 70 provided between the first radio-frequency power supply 61 and the controller 64*b*. The synchronization signal generator 70 is configured to receive a radio-frequency signal synchronized with the radio-frequency power LF from the first radio-frequency power supply 61 and generate a synchronization signal SS from the radio-frequency signal.

Figure 4:
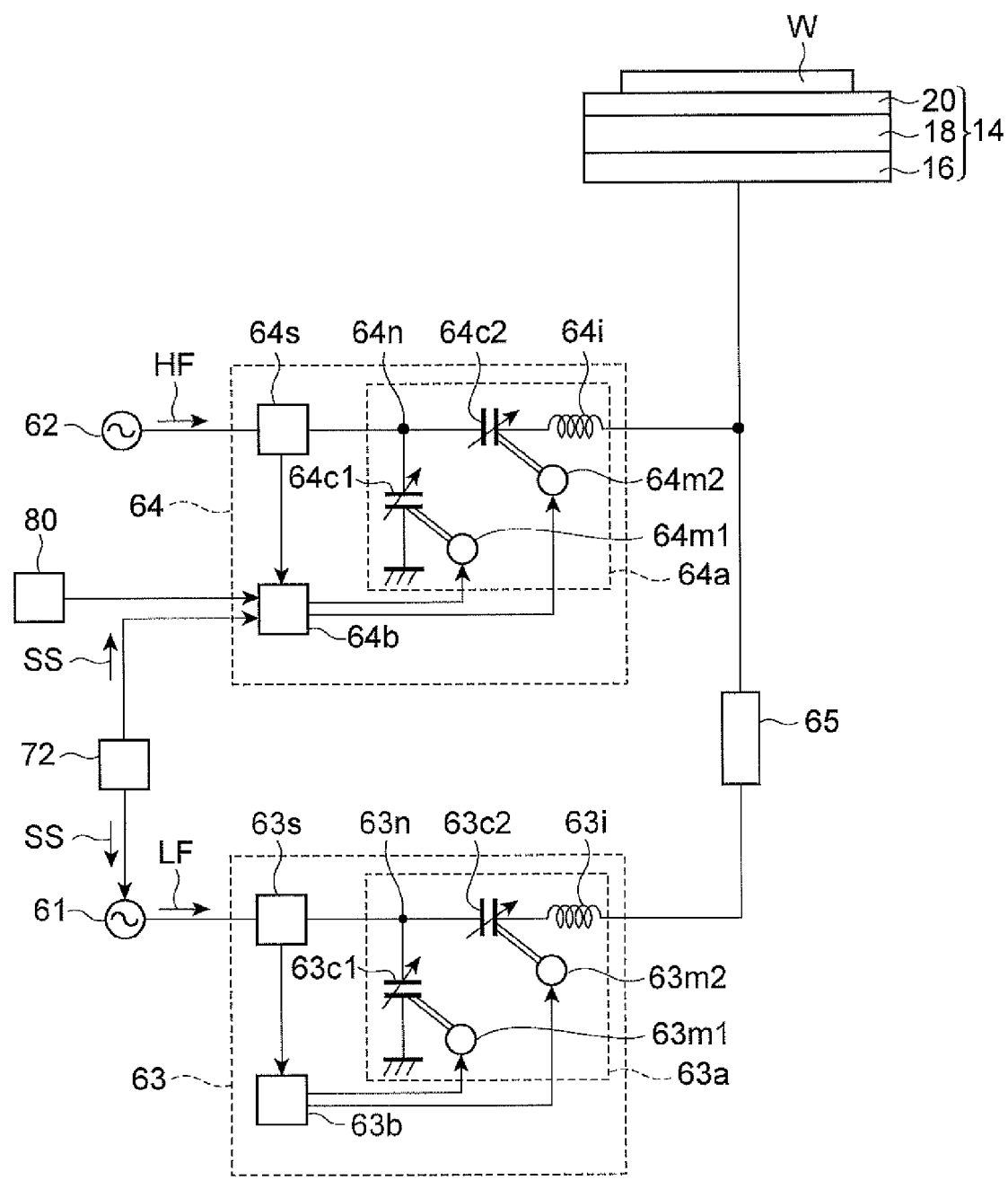
FIG. 4 is a view illustrating another exemplary configuration of a power supply system including two matchers of the plasma processing apparatus illustrated in FIG. 1.

FIG. 4 is a view illustrating another exemplary configuration of a power supply system including two matchers of the plasma processing apparatus illustrated in FIG. 1. As illustrated in FIG. 4, the synchronization signal SS may be generated by another synchronization signal generator 72. The synchronization signal SS generated by the synchronization signal generator 72 is given to the first radio-frequency power supply 61 and the controller 64*b*. In this example, the first radio-frequency power supply 61 outputs the radio-frequency power LF to synchronize with the synchronization signal SS generated by the synchronization signal generator 72.

The controller 64*b* specifies the partial period $P_M$ using the synchronization signal SS and the delay time and the time length given from the control unit 80. The start time of the partial period $P_M$ is specified from the timing of the synchronization pulse of the synchronization signal SS and the delay time given from the control unit 80. The time length of the partial period $P_M$ is specified from the time length given from the control unit 80.

In an embodiment, the controller 64*b* is configured to acquire an impedance $Z_2$ on the load side of the second radio-frequency power supply 62 in the partial period $P_M$ within each cycle $P_{LF}$. The controller 64*b* sets the impedance of the matching circuit 64*a* so as to reduce the difference between the impedance $Z_1$ in the partial period $P_M$ and the output impedance of the second radio-frequency power supply 62. In another embodiment, the controller 64*b* is configured to acquire the power of a reflected wave from the load of the second radio-frequency power supply 62. The controller 64*b* sets the impedance of the matching circuit 64*a* so as to reduce the power of the acquired reflected wave.

In an embodiment, the controller 64*b* sets the reactance of each of the one or more variable reactance elements described above of the matching circuit 64*a* in order to set the impedance of the matching circuit 64*a*. In an example, each of the capacitor 64*c*1 and the capacitor 64*c*2 is a mechanical variable capacitance capacitor. The capacitance of the capacitor 64*c*1 is adjusted by a motor 64*m*1. The capacitance of the capacitor 64*c*2 is adjusted by a motor 64*m*2. The controller 64*b* is configured to control the motor 64*m*1 and the motor 64*m*2 in order to set the capacitance of the capacitor 64*c*1 and the capacitance of the capacitor 64*c*1. The reactance of each of the one or more variable reactance elements of the set matching circuit 64*a* may also be maintained in a period other than the partial period $P_M$ in addition to the partial period $P_M$ within the one or more periods $P_{LF}$ after the reactance of each of the one or more variable reactance elements is set.

In another embodiment, the controller 64*b* sets the conductive state of the switching element of each of the above-described plurality of serial circuits of the matching circuit 64*a* in order to set the impedance of the matching circuit 64*a*. The set conductive state of the switching element of each of the plurality of series circuit may also be maintained in a period other than the partial period $P_M$ in addition to the partial period $P_M$ in the one or more periods $P_{LF}$ after the conductive state is set.

In an embodiment, the sensor 64*s* is configured to measure the voltage on the electrical path between the second radio-frequency power supply 62 and the matching circuit 64*a* and the current flowing on the electrical path. The controller 64*b* is configured to specify the impedance $Z_2$ from the voltage and current measured by the sensor 64*s* in the partial period $P_M$.

The impedance $Z_2$ is obtained by, for example, $V_2/I_2$. $V_2$ and $I_2$ may be a voltage and a current acquired by the sensor 64*s* in the partial period $P_M$. $V_2$ and $I_2$ may be an average value of the voltage and an average value of the current acquired by the sensor 64*s* in the partial period $P_M$. Each of the average value of the voltage and the average value of the current may be generated by a sample hold circuit provided between the controller 64*b* and the sensor 64*s*. Alternatively, the average value of the voltage may be generated when the controller 64*b* performs an averaging processing with respect to the voltage acquired by the sensor 64*s* in the partial period $P_M$. Alternatively, the average value of the voltage may be generated when the controller 64*b* performs an averaging processing with respect to the current acquired by the sensor 64*s* in the partial period $P_M$. $V_2$ and $I_2$ may be a moving average value of the voltage and a moving average value of the current acquired by the sensor 64*s* in some past partial periods $P_M$.

In another embodiment, the sensor 64*s* may be configured to obtain a parameter that reflects the power of the reflected wave from the load of the second radio-frequency power supply 62. The controller 64*b* sets the impedance of the matching circuit 64*a* so as to reduce reflected waves depending on the parameter obtained by the sensor 64*s*.

The plasma processing apparatus 1 may further include a control unit 80. The control unit 80 may be a computer including, for example, a processor, a storage unit such as, for example, memory, an input device, a display device, and a signal input/output interface. The control unit 80 controls each unit of the plasma etching apparatus 1. In the control unit 80, an operator is capable of performing, for example, an input operation of a command in order to manage the plasma processing apparatus 1 using the input device. In addition, in the control unit 80, the operation situation of the plasma processing apparatus 1 may be visualized and displayed by the display device. In addition, a control program and recipe data are stored in the storage unit of the control unit 80. The control program is executed by the processor of the control unit 80 in order to execute various processings in the plasma processing apparatus 1. The method MT to be described later and a plasma processing method of various embodiments are executed by the plasma processing apparatus 1 when the processor of the control unit 80 executes the control program to control each unit of the plasma processing apparatus 1 according to the recipe data.

Figure 5:
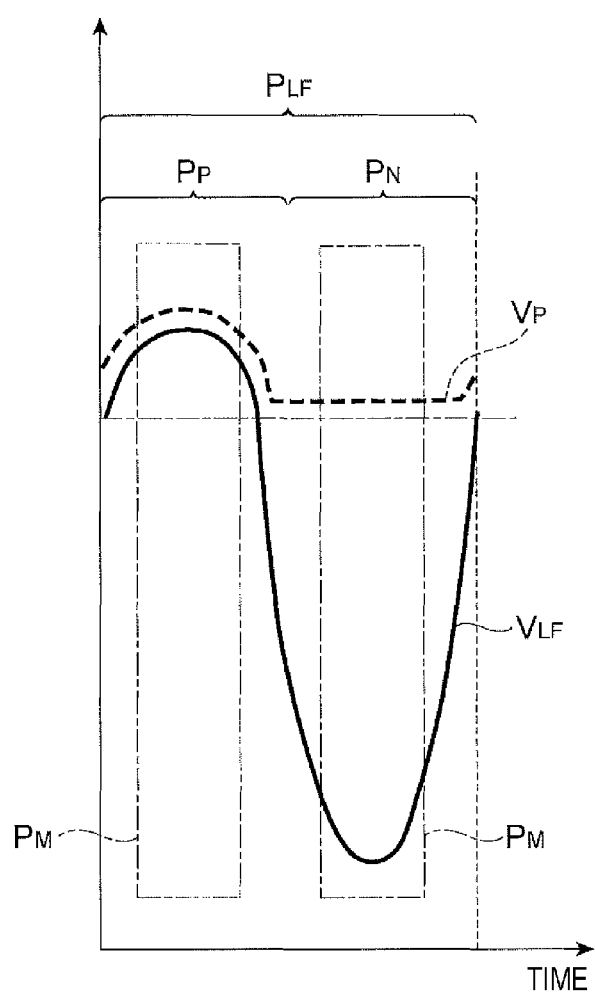
FIG. 5 is an exemplary timing chart illustrating substrate potential and plasma potential based on first radio-frequency power.

Hereinafter, reference is made to FIG. 5. FIG. 5 is an exemplary timing chart illustrating substrate potential and plasma potential based on first radio-frequency power. In a period in which the voltage of the radio-frequency power LF output from the first radio-frequency power supply 61 has a positive polarity (period $P_P$), the potential $V_{LF}$ of the substrate W based on the radio-frequency power LF becomes the potential of the positive polarity. In the period $P_P$, the potential $V_P$ of plasma is slightly higher than the potential $V_{LF}$. Accordingly, in the period $P_P$, the potential difference between the substrate W and the plasma is small, and a sheath (plasma sheath) is thin. Therefore, in the period $P_P$, the energy of ions supplied from the plasma to the substrate W is low.

Meanwhile, in a period in which the voltage of the radio-frequency power LF output from the first radio-frequency power supply 61 has a negative polarity (period $P_N$), the potential $V_{LF}$ of the substrate W based on the radio-frequency power LF becomes the potential of the negative polarity. In the period $P_N$, the potential of the plasma is lowered but has a positive polarity. Accordingly, in the period $P_N$, the potential difference between the substrate W and the plasma is large, and a sheath (plasma sheath) is thick. Therefore, in the period $P_N$, the energy of ions supplied from the plasma to the substrate W is high.

In the plasma processing apparatus 1, in the partial period $P_M$ in each cycle $P_{LF}$, the reflection to the radio-frequency power HF is decreased, and the plasma generation efficiency is increased. Meanwhile, in a period other than the partial period $P_M$ in each cycle $P_{LF}$, the reflection to the radio-frequency power HF is increased, and the plasma generation efficiency is decreased. Therefore, in the plasma processing apparatus 1, by designating the partial period $P_M$ in each cycle $P_{LF}$ of the radio-frequency power LF, ions having desired ion energy are efficiently generated and supplied to the substrate. In addition, since efficient generation of ions having desired ion energy may be realized by designation of the partial period $P_M$, a plasma processing apparatus having a relatively inexpensive and relatively simple configuration is provided.

In an embodiment, the partial period $P_M$ may be a period within the period $P_N$ in which the voltage of the radio-frequency power LF has a negative polarity. According to this embodiment, ions having high energy are efficiently generated and supplied to the substrate W.

In an embodiment, the partial period $P_M$ may be a period within the period $P_P$ in which the voltage of the radio-frequency power LF has a positive polarity. According to this embodiment, ions having low energy are efficiently generated and supplied to the substrate.

In addition, when the partial period $P_M$ is a period within the period $P_N$ in which the voltage of the radio-frequency power LF has a negative polarity, the potential based on the radio-frequency power HF becomes dominant in the potential of the substrate W. Meanwhile, when the partial period $P_M$ is a period within the period $P_N$ in which the voltage of the radio-frequency power LF has a positive polarity, the potential based on the radio-frequency power LF becomes predominant in the potential of the substrate W. The higher the frequency of the radio-frequency power which has a predominant influence on the potential of the substrate W, the smaller the potential at the edge of the substrate W than the potential at the center of the substrate W. Accordingly, the higher the frequency of the radio-frequency power which has a dominant influence on the potential of the substrate W, the lower the uniformity of the processing speed (e.g., the etching rate) of the substrate W. As described above, in the plasma processing apparatus 1, the partial period $P_M$ may be designated within each cycle $P_{LF}$ of the radio-frequency power LF. Therefore, with the plasma processing apparatus 1, by designating the partial period $P_M$ within each cycle $P_{LF}$ of the radio-frequency power LF, it is also possible to adjust uniformity of the processing speed of the substrate W in the radial direction.

Regarding the plasma processing apparatus 1, each of the relationship between the above-described partial period $P_M$ and energy of ions and the relationship between the partial period $P_M$ and the uniformity of the processing speed of the substrate W in the radial direction is a relationship in the case in which positive plasma is generated within the chamber 10. Positive plasma refers to plasma in which positive ions predominantly with respect to negative ions. Meanwhile, in the case in which negative plasma is generated within the chamber 10, each of the relationship between the partial period $P_M$ and energy of ions and the relationship between the partial period $P_M$ and the uniformity of the processing speed of the substrate W in the radial direction is opposite to the relationship described above for the case in which positive plasma is generated. Here, negative plasma refers to plasma in which negative ions predominantly exists with respect to positive ions.

Figure 6:
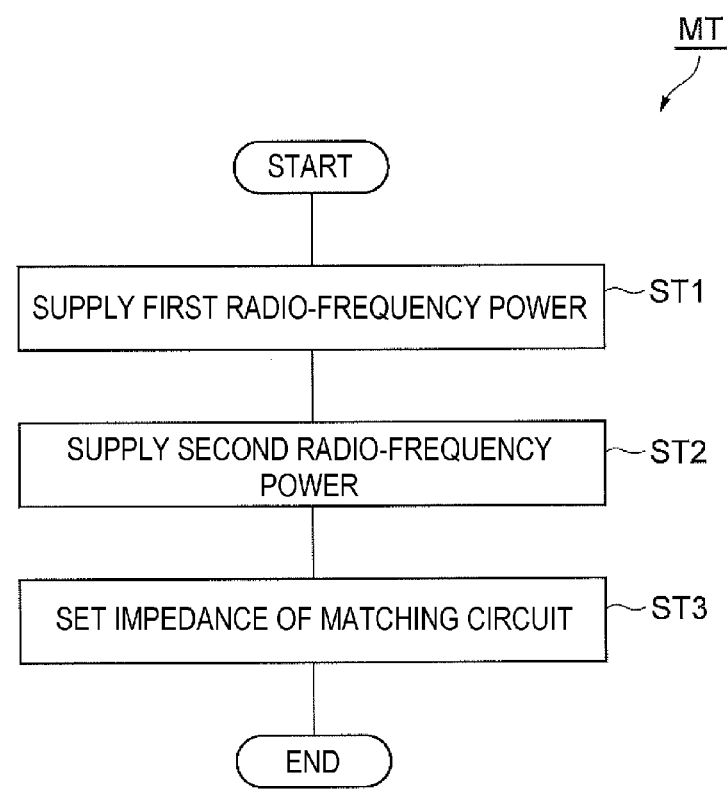
FIG. 6 is a flowchart illustrating an impedance matching method according to an embodiment.

Hereinafter, an impedance matching method according to an embodiment will be described with reference to FIG. 6. FIG. 6 is a flowchart illustrating an impedance matching method according to an embodiment. Hereinafter, the impedance matching method (hereinafter, referred to as "method MT") illustrated in FIG. 6 will be demonstrated, taking the case in which the plasma processing apparatus 1 is used by way of an example.

During the execution of the method MT, a substrate W is placed on the support 14 (electrostatic chuck 20). During the execution of the method MT, a gas is supplied into the chamber 10 from the gas supply section GS of the plasma processing apparatus 1. In addition, during the execution of the method MT, the pressure within the chamber 10 is adjusted by the exhaust apparatus 50 to a designated pressure.

In step ST1 of the method MT, the radio-frequency power LF is supplied to the lower electrode 18 from the first radio-frequency power supply 61 via the first matcher 63. Step ST2 of the method MT is executed during the execution of step ST1. In step ST2, the radio-frequency power HF is supplied from the second radio-frequency power supply 62 via the second matcher 64.

In step ST3, the impedance of the matching circuit 64a is set as described above such that a reflection from the load of the second radio-frequency power supply 62 is reduced in a partial period $P_M$ in each cycle $P_{LF}$ of the radio-frequency power LF. Steps ST1 to ST3 are continuously executed until the plasma processing is terminated.

Figure 7:
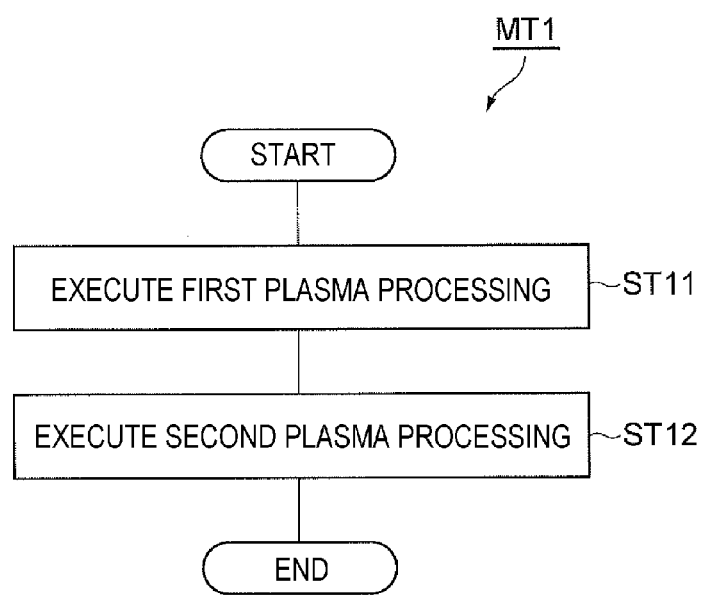
FIG. 7 is a flowchart illustrating a plasma processing method according to an embodiment.
Figure 8A:
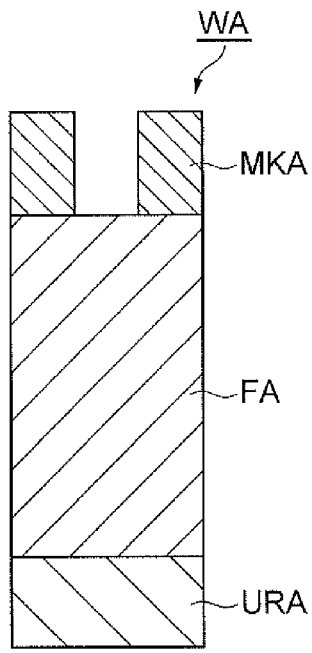
FIG. 8A is a partially enlarged cross-sectional view of an exemplary substrate.
Figure 8B:
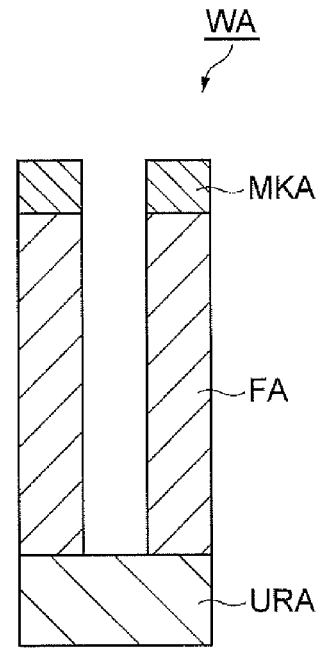
FIGS. 8B and 8C are partially enlarged cross-sectional views illustrating an exemplary substrate after executing a plurality of steps of the plasma processing method illustrated in FIG. 7, respectively.
Figure 8C:
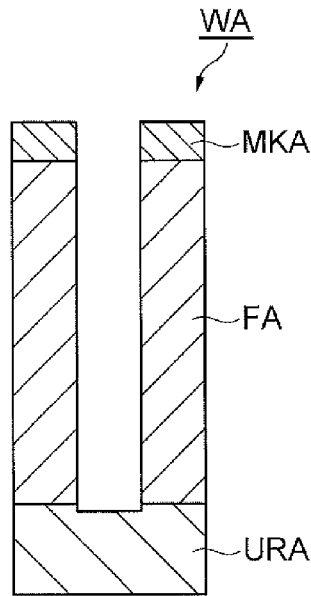

Hereinafter, a plasma processing method according to various embodiments will be described. FIG. 7 is a flowchart illustrating a plasma processing method according to an embodiment. FIG. 8A is a partially enlarged cross-sectional view of an exemplary substrate. FIGS. 8B and 8C are partially enlarged cross-sectional views illustrating an exemplary substrate after executing a plurality of steps of the plasma processing method illustrated in FIG. 7, respectively.

The plasma processing method (hereinafter, referred to as "method MT1") illustrated in FIG. 7 includes step ST11 and step ST12. Step ST11 is executed in a first period. The time length of the first period may be m times the time length of one cycle of the radio-frequency power LF. Here, m is a natural number. A first plasma processing is executed in step ST11. Step ST11 is executed in a second period. The second period is a period following the first period. A second plasma processing is executed in step ST12. The time length of the second period may be n times the time length of one cycle of the radio-frequency power LF. Here, n is a natural number.

In step ST11 and step ST12, a processing gas is supplied into the chamber 10. In step ST11 and step ST12, the gas supply section GS is controlled by the control unit 80 to supply the processing gas. In step ST11 and step ST12, the exhaust apparatus 50 is controlled by the control unit 80 to set the pressure within the chamber 10 to a designated pressure. The pressure within the chamber 10 is set to, for example, a pressure in the range of several mTorr to 1000 mTorr.

In each of steps ST11 and ST12, steps ST1 to ST3 are executed. In each of steps ST11 and ST12, the control unit 80 controls the first radio-frequency power supply 61, the second radio-frequency power supply 62, and the second matcher 64 so as to execute steps ST1 to ST3.

In step ST11, the partial period $P_M$ is set within the period $P_N$. In step ST11, the control unit 80 controls the second matcher 64 to set the partial period $P_M$ within the period $P_N$. In step ST12, the partial period $P_M$ is set within the period $P_P$. In step ST12, the control unit 80 controls the second matcher 64 to set the partial period $P_M$ within the period $P_P$.

In step ST11 and step ST12, plasma is formed from the processing gas within the chamber 10. In step ST11, since the partial period $P_M$ is set within the period $P_N$, the energy of ions directed from the plasma to the support 14 is relatively high. Meanwhile, in step ST12, since the partial period $P_M$ is set within the period $P_N$, the energy of ions directed from the plasma to the support 14 is relatively low.

As illustrated in FIG. 8A, a substrate WA to which the method MT1 is applicable has a base area URA and a film FA. The film FA is provided on the base area URA. The substrate WA may further have a mask MKA. The mask MKA is provided on the film FA. The mask MKA is patterned so as to partially expose the film FA. In an example, the base area URA is formed of silicon, the film FA is formed of silicon oxide, and the mask MKA has a multilayer structure including a photoresist film and an antireflection film. The antireflection film of the mask MKA is provided on the film FA. The antireflection film of the mask MKA contains silicon. The photoresist film of the mask MKA is provided on the antireflection film of the mask MKA. The mask MKA may be formed of an amorphous carbon film.

In the method MT1, the substrate WA is disposed within the chamber 10 over the first period and the second period. The substrate WA is disposed on the support 14 within the chamber 10. The processing gas used in step ST11 and step ST12 may include a fluorocarbon gas such as, for example, $C_4F_8$ gas. The processing gas used in step ST11 and step ST12 may further include an oxygen-containing gas such as, for example, $O_2$ gas and/or a rare gas such as, for example, argon gas.

As illustrated in FIG. 8B, in step ST11, the film FA is etched by ions from the plasma so as to expose the base area URA. When it is determined that the etching amount of the film FA is decreased from the light emission intensity acquired by the light emission analyzer 54, step ST11 is terminated. For example, when it is determined that the light emission intensity of CO acquired by the light emission analyzer 54 is equal to or lower a predetermined value, step ST11 is terminated. Alternatively, step ST11 is terminated after the lapse of a predetermined time. In step ST11, since ions of high energy are supplied to the substrate WA, the film FA is etched at a high speed.

In the subsequent step ST12, overetching of the film FA is performed as illustrated in FIG. 8C. In step ST12, since ions of low energy are supplied to the substrate WA, it is possible to perform overetching of the film FA while suppressing damage to the base area URA.

Figure 9:
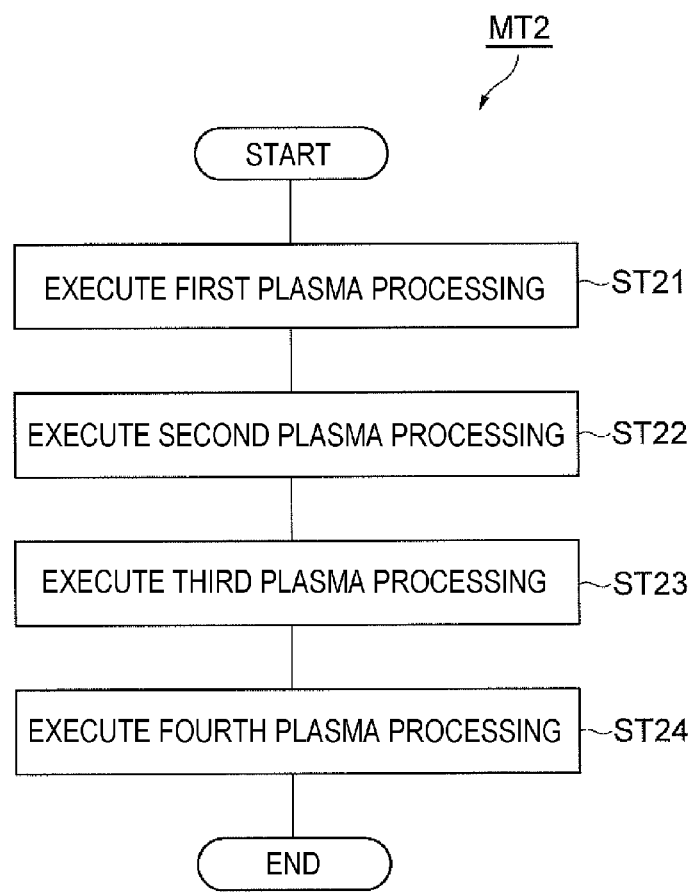
FIG. 9 is a flowchart illustrating a plasma processing method according to another embodiment.
Figure 10A:
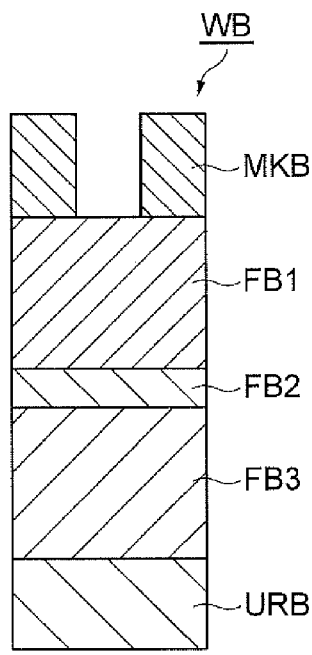
FIG. 10A is a partially enlarged cross-sectional view of an exemplary substrate.

Next, reference is made to FIGS. 9, 10A, 10B, 10C, 10D, and 10E. FIG. 9 is a flowchart illustrating a plasma processing method according to another embodiment. FIG. 10A is a partially enlarged cross-sectional view of an exemplary substrate. FIGS. 10B to 10E are partially enlarged cross-sectional views illustrating an exemplary substrate after executing a plurality of steps of the plasma processing method illustrated in FIG. 9, respectively.

The plasma processing method (hereinafter, referred to as "method MT2") illustrated in FIG. 9 includes step ST21 and step ST22. Step ST21 is executed in a first period like step S11 of the method MT1. A first plasma processing is executed in step ST21. Step ST21 is executed in a second period like step S12 of the method MT1. The second period is a period following the first period. A second plasma processing is executed in step ST22.

The MT2 may further include step ST23 and step ST24. Step ST23 is executed in a third period. The third period is a period following the second period. The time length of the third period may be p times the time length of one cycle of the radio-frequency power LF. Here, p is a natural number. A third plasma processing is executed in step ST23. Step ST24 is executed in a fourth period. The fourth period is a period following the third period. The time length of the fourth period may be q times the time length of one cycle of the radio-frequency power LF. Here, q is a natural number. A fourth plasma processing is executed in step ST24.

In step ST21, step 22, step 23, and step ST24, a processing gas is supplied into the chamber 10. In step ST21, step S22, step S23, and step ST24, the gas supply section GS is controlled by the control unit 80 to supply the processing gas. In step ST21, step ST22, step ST23, and step ST24, the exhaust apparatus 50 is controlled by the control unit 80 to set the pressure within the chamber 10 to a designated pressure. The pressure within the chamber 10 is set to, for example, a pressure in the range of several mTorr to 1000 mTorr.

In each of steps ST21, step ST22, step ST23, and step ST24, steps ST1 to ST3 are executed. In each of step ST21, step ST22, step ST23, and step ST24, the control unit 80 controls the first radio-frequency power supply 61, the second radio-frequency power supply 62, and the second matcher 64 so as to execute steps ST1 to ST3.

In each of step ST21 and step ST23, the partial period $P_M$ is set within the period $P_N$. In each of step ST21 and step ST23, the control unit 80 controls the second matcher 64 to set the partial period $P_M$ within the period $P_N$. In each of step ST22 and step ST24, the partial period $P_M$ is set within the period $P_N$. In each of step ST22 and step ST24, the control unit 80 controls the second matcher 64 to set the partial period $P_M$ within the period $P_P$.

In each of step ST21, step 22, step 23, and step ST24, plasma is formed from the processing gas supplied into the chamber 10. In each of step ST21 and step ST22, since the partial period $P_M$ is set within the period $P_N$, the energy of ions directed from the plasma to the support 14 is relatively high. In each of step ST22 and step ST24, since the partial period $P_M$ is set within the period $P_P$, the energy of ions directed from the plasma to the support 14 is relatively low.

As illustrated in FIG. 10A, a substrate WA to which the method MT2 is applicable has a first film FB1 and a second film FB2. The first film FB1 is provided on the second film FB2. The substrate WB may further include a base area UBR, a third film FB3, and a mask MKB. The third film FB3 is provided on the base area URA. The second film FB2 is provided on the third film FB3. The mask MKB is provided on the first film FB1. The mask MKB is patterned so as to partially expose the first film FB1. In an example, the base area URB is formed of silicon. The first film FB1 and the third film FB3 are formed of silicon oxide. The second film FB2 is formed of silicon nitride. The mask MKB is formed of a photoresist film. The mask MKB may be formed of an amorphous carbon film.

In the method MT2, the substrate WA is disposed within the chamber 10 over the first to fourth periods. The substrate WB is disposed on the support 14 within the chamber 10. The processing gas used in step ST21, step ST22, step ST23, and step ST24 may include a fluorocarbon gas such as, for example, $C_4F_8$ gas. The processing gas used in step ST21, step ST22, step ST23, and step ST24 may further include an oxygen-containing gas such as, for example, $O_2$ gas and/or a rare gas such as, for example, argon gas.

Figure 10B:
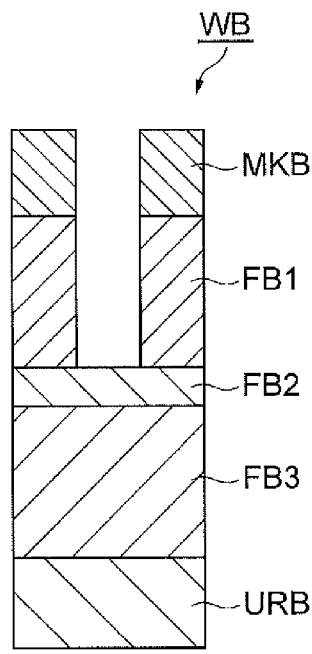
FIGS. 10B to 10E are partially enlarged cross-sectional views illustrating an exemplary substrate after executing a plurality of respective steps of the plasma processing method illustrated in FIG. 9, respectively.

As illustrated in FIG. 10B, in step ST21, ions from the plasma are radiated to the first film FB1 and the first film FB1 is etched by chemical ion etching so as to expose the second film FB2. When it is determined that the etching amount of the film FB1 is decreased from the light emission intensity acquired by the light emission analyzer 54, step ST21 is terminated. For example, when it is determined that the light emission intensity of CO acquired by the light emission analyzer 54 is equal to or lower than a predetermined value or when it is determined that the light emission intensity of CN acquired by the light emission analyzer 54 is equal to or higher than another predetermined value, step ST21 is terminated. Alternatively, step ST21 is terminated after the lapse of a predetermined time.

Figure 10C:
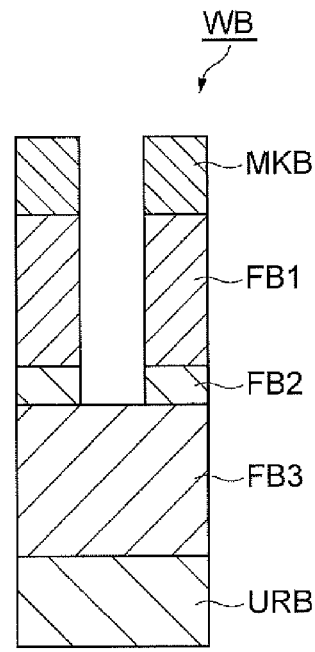

As illustrated in FIG. 10C, in step ST22, ions from the plasma are radiated to the second film FB2 and the second film FB2 is etched by chemical ion etching so as to expose the third film FB3. When it is determined that the etching amount of the film FB2 is decreased from the light emission intensity acquired by the light emission analyzer 54, step ST22 is terminated. For example, when it is determined that the light emission intensity of CN acquired by the light emission analyzer 54 is equal to or lower than a predetermined value or when it is determined that the light emission intensity of CO acquired by the light emission analyzer 54 is equal to or higher than another predetermined value, step ST22 is terminated. Alternatively, step ST22 is terminated after the lapse of a predetermined time.

Figure 10D:
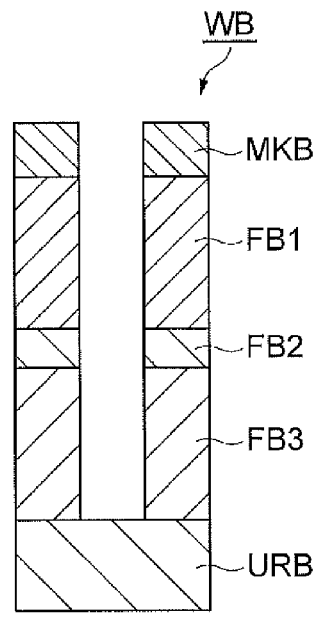

As illustrated in FIG. 10D, in step ST23, ions from the plasma are radiated to the third film FB3 and the third film FB3 is etched by chemical ion etching so as to expose the base area URB. When it is determined that the etching amount of the film FB3 is decreased from the light emission intensity acquired by the light emission analyzer 54, step ST23 is terminated. For example, when it is determined that the light emission intensity of CO acquired by the light emission analyzer 54 is equal to or lower a predetermined value, step ST23 is terminated. Alternatively, step ST23 is terminated after the lapse of a predetermined time.

Figure 10E:
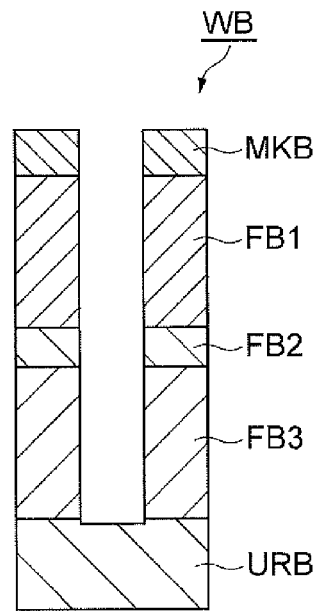

In the subsequent step ST24, overetching of the third film FB3 is performed as illustrated in FIG. 10E. In step ST24, since ions of low energy are supplied to the substrate WB, it is possible to perform overetching of the third film FB3 while suppressing damage to the base area URB.

According to this method MT2, it is possible to etch a multilayer film having a film requiring relatively high energy for etching as the first film FB1 and having a film capable of being etched with relatively low energy as the second film FB2. In addition, it is possible to etch a multilayer film having a film requiring relatively high energy for etching as the third film FB3 between the second film FB2 and the base area URB.

Figure 11:
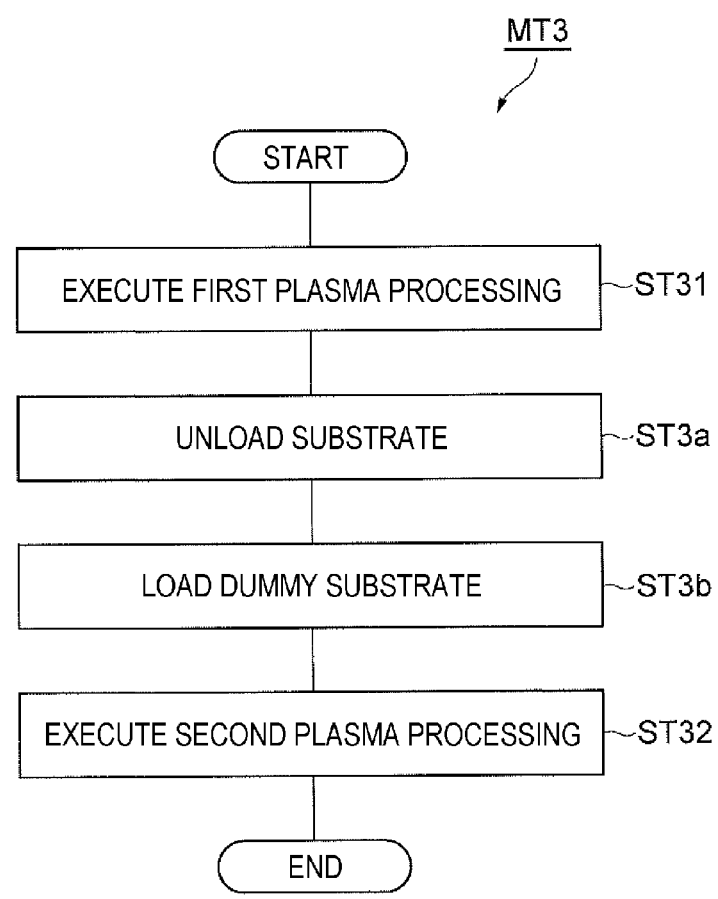
FIG. 11 is a flowchart illustrating a plasma processing method according to still another embodiment.
Figure 12A:
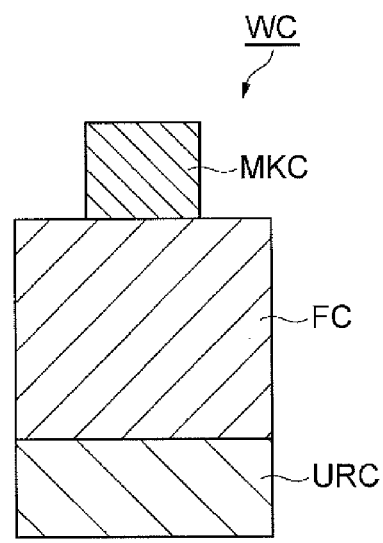
FIG. 12A is a partially enlarged cross-sectional view of an exemplary substrate.
Figure 12B:
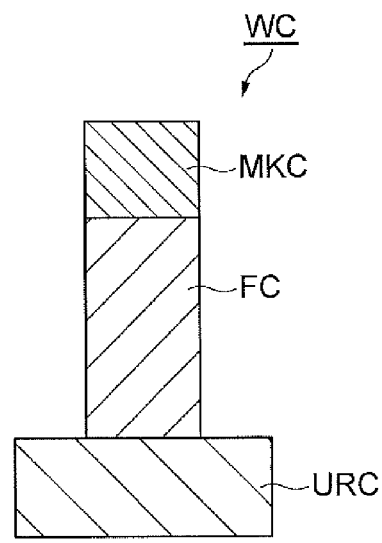
FIG. 12B is a partially enlarged cross-sectional view illustrating an exemplary substrate after executing ST31 of the plasma processing method illustrated in FIG. 11.

Next, reference is made to FIGS. 11, 12A and 12B. FIG. 11 is a flowchart illustrating a plasma processing method according to still another embodiment. FIG. 12A is a partially enlarged cross-sectional view of an exemplary substrate. FIG. 12B is a partially enlarged cross-sectional view illustrating an exemplary substrate after executing step S31 of the plasma processing method illustrated in FIG. 11.

The plasma processing method (hereinafter, referred to as "method MT3") illustrated in FIG. 11 includes step ST31 and step ST32. Step ST31 is executed in a first period like step S11 of the method MT1. A first plasma processing is executed in step ST31. Step ST32 is executed in a second period like step S12 of the method MT1. The second period is a period after the first period or following the first period. A second plasma processing is executed in step ST32.

In step ST31 and step ST32, a processing gas is supplied into the chamber 10. In step ST31 and step ST32, the gas supply section GS is controlled by the control unit 80 to supply the processing gas. In step ST31 and step ST32, the exhaust apparatus 50 is controlled by the control unit 80 to set the pressure within the chamber 10 to a designated pressure.

In each of steps ST31 and ST32, steps ST1 to ST3 are executed. In each of steps ST31 and ST32, the control unit 80 controls the first radio-frequency power supply 61, the second radio-frequency power supply 62, and the second matcher 64 so as to execute steps ST1 to ST3.

In step ST31, the partial period $P_M$ is set within the period $P_N$. In step ST31, the control unit 80 controls the second matcher 64 to set the partial period $P_M$ within the period $P_N$. In step ST32, the partial period $P_M$ is set within the period $P_P$. In step ST32, the control unit 80 controls the second matcher 64 to set the partial period $P_M$ within the period $P_P$.

In step ST31 and step ST32, plasma is formed from the processing gas within the chamber 10. In step ST31, since the partial period $P_M$ is set within the period $P_N$, the energy of ions directed from the plasma to the support 14 is relatively high. Meanwhile, in step ST32, since the partial period $P_M$ is set within the period $P_P$, the energy of ions directed from the plasma to the support 14 is relatively low, and the energy of ions directed from the plasma to the inner wall surface of the chamber 10 is relatively high.

As illustrated in FIG. 12A, a substrate WA to which the method MT3 is applicable has a base area URC and a film FC. The film FC is provided on the base area URC. The substrate WC may further have a mask MKC. The mask MKC is provided on the film FC. The mask MKC is patterned so as to partially expose the surface of the film FC. In an example, the base area URC is formed of TaN, the film FC is a multilayer film including some magnetic layers, and the mask MKC is formed of silicon oxide. The multilayer film of the film FC is, for example, a multilayer film constituting an MRAM element portion, and includes a magnetic tunnel junction (MTJ) structure.

In the method MT3, the substrate WC is disposed within the chamber 10 over in the first period. The substrate WC is disposed on the support 14 within the chamber 10. The processing gas used in step ST31 and step ST32 may be a mixed gas containing $Cl_2$ gas and a rare gas such as, for example, argon gas, or a mixed gas containing CO gas and $NH_3$ gas.

As illustrated in FIG. 12B, in step ST23, ions from the plasma are radiated to the film FC and the film FC is etched by chemical ion etching and/or sputtering so as to expose the base area URC. When it is determined that the etching amount of the film FC is decreased from the light emission intensity acquired by the light emission analyzer 54, step ST31 is terminated. Alternatively, step ST31 is terminated after the lapse of a predetermined time. In step ST31, since ions of high energy are supplied to the substrate WC, it is possible to etch the film FC formed of a hard-to-etch material.

The method MT3 may further include step ST3a. Step ST3a is executed between step ST31 and step ST32. In step ST3a, the substrate WC is unloaded from the inner space 10s of the chamber 10. Accordingly, step ST32 may be performed in a state in which the substrate WC is not disposed within the chamber 10. The method MT3 may further include step ST3b. Step ST3b is executed between step ST3a and step ST32. In step ST3b, a dummy substrate is loaded into the chamber 10. The dummy substrate is disposed on the support 14. Accordingly, step ST32 may be executed in a state in which the dummy substrate is placed on the support 14.

In step ST31, deposit is attached to the inner wall surface of the chamber 10. The deposit may be an etch byproduct. In step ST32, the deposit attached to the inner wall surface of the chamber 10 is removed by chemical species such as, for example, ions and/or radicals from the plasma. In the second period in which step ST32 is executed, the energy of ions directed from the plasma to the support 14 is relatively low, and the energy of ions directed from the plasma to the inner wall surface of the chamber 10 is relatively high. As a result, the deposit attached to the inner wall surface of the chamber 10 is efficiently removed.

Figure 13:
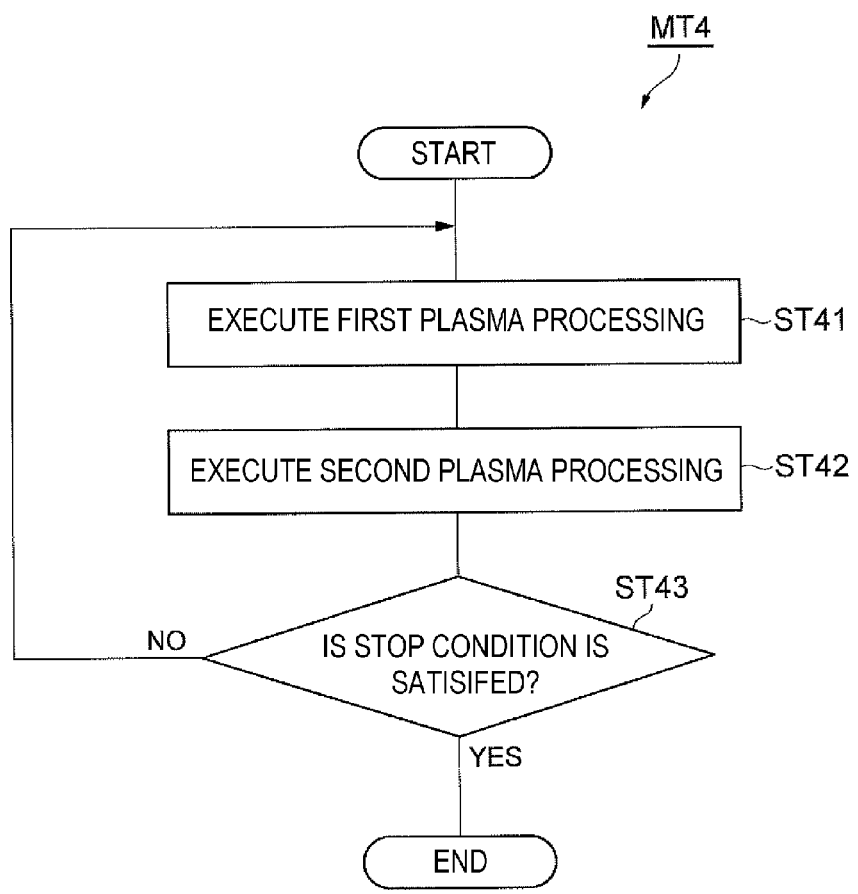
FIG. 13 is a flowchart illustrating a plasma processing method according to still another embodiment.
Figure 14A:
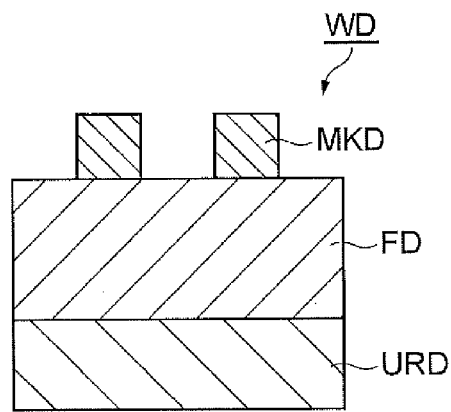
FIG. 14A is a partially enlarged cross-sectional view of an exemplary substrate.
Figure 14B:
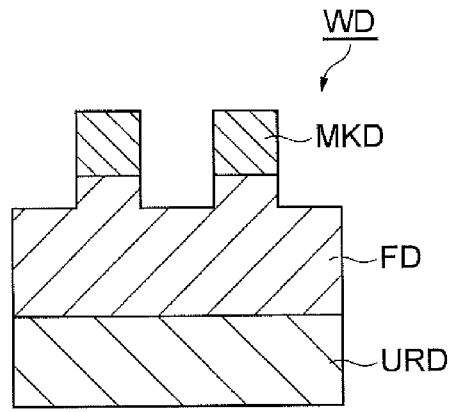
FIGS. 14B to 14D are partially enlarged cross-sectional views illustrating an exemplary substrate after executing a plurality of respective steps of the plasma processing method illustrated in FIG. 13, respectively.
Figure 14C:
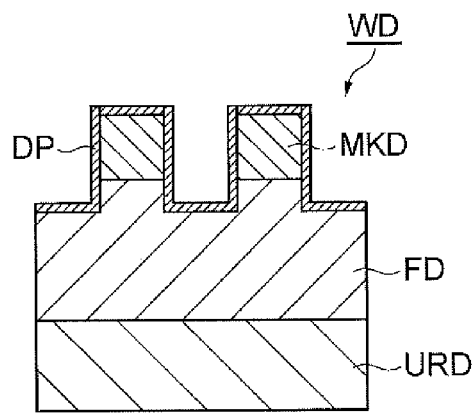
Figure 14D:
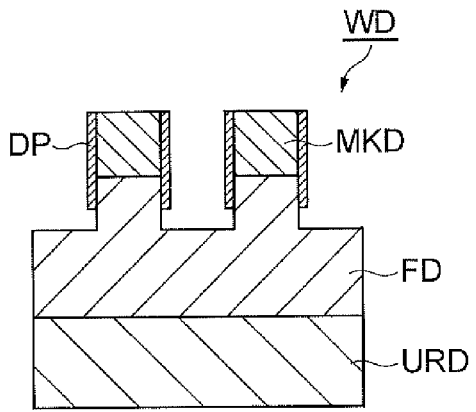

Next, reference is made to FIGS. 13, 14A, 14B, 14C, and 14D. FIG. 13 is a flowchart illustrating a plasma processing method according to still another embodiment. FIG. 14A is a partially enlarged cross-sectional view of an exemplary substrate. FIGS. 14B to 14D are partially enlarged cross-sectional views illustrating an exemplary substrate after executing a plurality of steps of the plasma processing method illustrated in FIG. 13, respectively.

The plasma processing method (hereinafter, referred to as "method MT4") illustrated in FIG. 13 includes step ST41 and step ST42. Step ST41 is executed in a first period like step S11 of the method MT1. The first period may be a period having a time length equal to the time length of a single cycle $P_{LF}$. A first plasma processing is executed in step ST41. Step ST42 is executed in a second period like step S12 of the method MT1. The second period is a period following the first period. The second period may be a period having a time length equal to the time length of the single cycle $P_{LF}$. A second plasma processing is executed in step ST42.

In step ST41, a processing gas is supplied into the chamber 10. In step ST42, the same processing gas as the processing gas used in step ST41 or a separate processing gas is supplied into the chamber 10. In step ST41 and step ST42, the gas supply section GS is controlled by the control unit 80. In step ST41 and step ST42, the exhaust apparatus 50 is controlled by the control unit 80 to set the pressure within the chamber 10 to a designated pressure. The pressure within the chamber 10 is set to, for example, a pressure in the range of several mTorr to 1000 mTorr.

In each of steps ST41 and ST42, steps ST1 to ST3 are executed. In each of steps ST41 and ST42, the control unit 80 controls the first radio-frequency power supply 61, the second radio-frequency power supply 62, and the second matcher 64 so as to execute steps ST1 to ST3.

In step ST41, the partial period $P_M$ is set within the period $P_N$. In step ST41, the control unit 80 controls the second matcher 64 to set the partial period $P_M$ within the period $P_N$. In step ST42, the partial period $P_M$ is set within the period $P_P$. In step ST42, the control unit 80 controls the second matcher 64 to set the partial period $P_M$ within the period $P_P$.

In step ST41 and step ST42, plasma is formed within the chamber 10. In step ST41, since the partial period $P_M$ is set within the period $P_N$, the energy of ions directed from the plasma to the support 14 is relatively high. Meanwhile, in step ST42, since the partial period $P_M$ is set within the period $P_P$, the energy of ions directed from the plasma to the support 14 is relatively low.

In the method MT4, the substrate is disposed within the chamber 10 over the first period and the second period. The substrate is disposed on the support 14 within the chamber 10. A substrate WD to which the method MT4 is applicable has a base area URD and a film FD as illustrated in FIG. 14A. The film FD is provided on the base area URD. The substrate WD may further have a mask MKD. The mask MKD is provided on the film FD. The mask MKD is patterned so as to partially expose the surface of the film FD. In an example, the base area URD is formed of silicon oxide, the film FD is an organic film or a silicon oxide film, and the mask MKD has a multilayer structure including a photoresist film and an antireflection film. The antireflection film of the mask MKD is provided on the film FD. The antireflection film of the mask MKD contains silicon. The photoresist film of the mask MKD is provided on the antireflection film of the mask MKD.

The processing gas used in step ST41 may include an oxygen-containing gas such as, for example, $O_2$ gas when the film FD is an organic film. The processing gas used in step ST41 may further include a rare gas such as, for example, argon gas when the film FD is an organic film. The processing gas used in step ST41 may include a fluorocarbon gas such as, for example, $C_4F_8$ gas when the film FD is a silicon oxide film. Even when the film FD is either an organic film or a silicon oxide film, the processing gas used in step ST41 may be a mixed gas including a fluorocarbon gas such as, for example, $C_4F_8$ gas, an oxygen-containing gas such as, for example, $O_2$ gas, and a rare gas such as, for example, argon gas.

Even when the film FD is either an organic film or a silicon oxide film, the processing gas used in step ST41 may include a fluorocarbon gas such as, for example, $C_4F_8$ gas. The processing gas used in step ST42 may further include an oxygen-containing gas such as, for example, $O_2$ gas and/or a rare gas such as, for example, argon gas.

In step ST41, the energy of the ions directed from the plasma to the support 14 is relatively high. Accordingly, in step ST41, ions from the plasma are radiated to the film FD, and the film FD is etched by chemical ion etching. As illustrated in FIG. 14B, in step ST41, the film FD is etched to provide a sidewall surface. In step ST42, the energy of the ions directed from the plasma to the support 14 is relatively low. In step ST42, as illustrated in FIG. 14C, chemical species from the plasma form a film of the deposit DP on the surface of the substrate WD. The film of the deposit DP is formed from species of carbon and/or fluorocarbon.

In the following step ST43, it is determined whether a stop condition is satisfied. In step ST43, the stop condition is determined to be satisfied when the number of times of execution of a sequence including step ST41 and step ST42 reaches a predetermined number. Alternatively, in step ST43, the stop condition may be determined based on the light emission intensity of a predetermined wavelength acquired by the light emission analyzer 54, and may be determined based on the execution time length of the sequence including step ST41 and step ST42 or the repetition of the sequence. When it is determined in step ST43 that the stop condition is not satisfied, the sequence including step ST41 and step ST42 is executed again. The etching of step ST41 has anisotropy. Accordingly, in step ST41, deposit DP extending on the sidewall surface of the substrate WD is left, as illustrated in FIG. 14D. Meanwhile, in step ST41, the deposit DP extending on the other surface (horizontal surface) of the substrate W is removed, and the film FD is further etched. When it is determined in step ST43 that the stop condition is satisfied, the method MT4 is terminated.

In the method MT4, step ST41 and step ST42 are alternately repeated. That is, in the method MT4, the formation of the deposit DP (step ST42) and the etching of the film FD (step ST41) are alternately performed. According to the method MT4, the sidewall surface of the film FD is protected by the deposit DP during the execution of the film FD etching.

Figure 15:
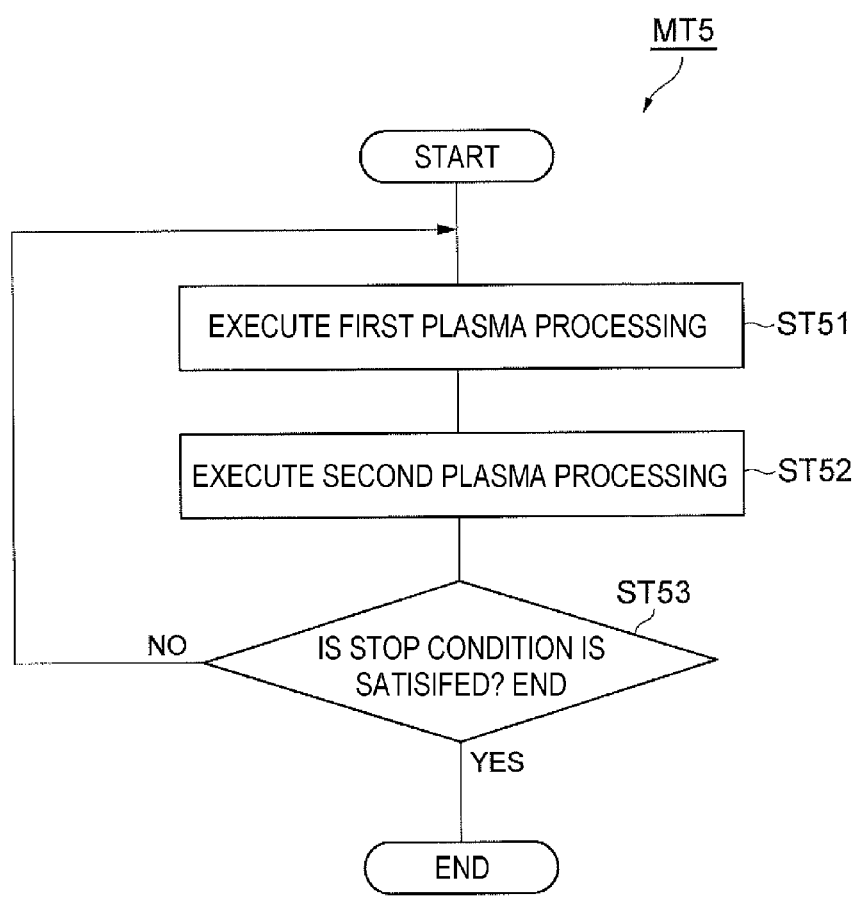
FIG. 15 is a flowchart illustrating a plasma processing method according to still another embodiment.
Figure 16A:
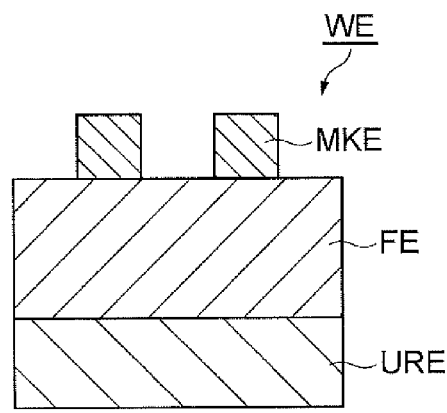
FIG. 16A is a partially enlarged cross-sectional view of an exemplary substrate.
Figure 16B:
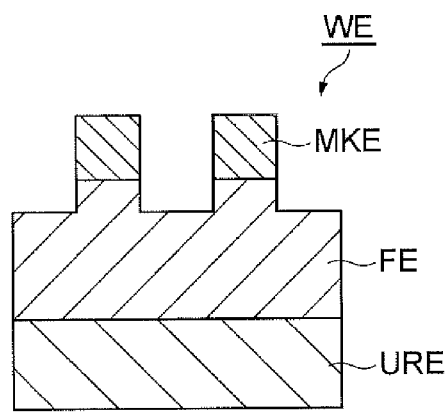
FIGS. 16B to 16D are partially enlarged cross-sectional views illustrating an exemplary substrate after executing a plurality of respective steps of the plasma processing method illustrated in FIG. 15, respectively.
Figure 16C:
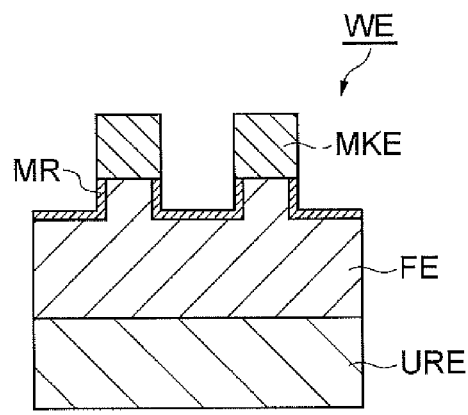
Figure 16D:
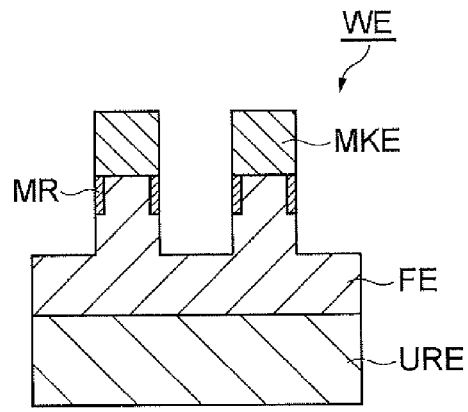

Next, reference is made to FIGS. 15, 16A, 16B, 16C, and 16D. FIG. 15 is a flowchart illustrating a plasma processing method according to still another embodiment. FIG. 16A is a partially enlarged cross-sectional view of an exemplary substrate. FIGS. 16B to 16D are partially enlarged cross-sectional views illustrating an exemplary substrate after executing a plurality of steps of the plasma processing method illustrated in FIG. 15, respectively.

The plasma processing method (hereinafter, referred to as "method MT5") illustrated in FIG. 15 includes step ST51 and step ST52. Step ST51 is executed in a first period like step S11 of the method MT1. The first period may be a period having a time length equal to the time length of a single cycle $P_{LF}$. A first plasma processing is executed in step ST51. Step ST52 is executed in a second period like step S12 of the method MT1. The second period is a period following the first period. The second period may be a period having a time length equal to the time length of the single cycle $P_{LF}$. A second plasma processing is executed in step ST52.

In step ST51, a processing gas is supplied into the chamber 10. In step ST52, the same processing gas as the processing gas used in step ST51 or a separate processing gas is supplied into the chamber 10. In step ST51 and step ST52, the gas supply section GS is controlled by the control unit 80. In step ST51 and step ST52, the exhaust apparatus 50 is controlled by the control unit 80 to set the pressure within the chamber 10 to a designated pressure. The pressure within the chamber 10 is set to, for example, a pressure in the range of several mTorr to 1000 mTorr.

In each of steps ST51 and ST52, steps ST1 to ST3 are executed. In each of steps ST51 and ST52, the control unit 80 controls the first radio-frequency power supply 61, the second radio-frequency power supply 62, and the second matcher 64 so as to execute steps ST1 to ST3.

In step ST51, the partial period $P_M$ is set within the period $P_N$. In step ST51, the control unit 80 controls the second matcher 64 to set the partial period $P_M$ within the period $P_N$. In step ST52, the partial period $P_M$ is set within the period $P_P$. In step ST52, the control unit 80 controls the second matcher 64 to set the partial period $P_M$ within the period $P_P$.

In step ST51 and step ST52, plasma is formed within the chamber 10. In step ST51, since the partial period $P_M$ is set within the period $P_N$, the energy of ions directed from the plasma to the support 14 is relatively high. Meanwhile, in step ST52, since the partial period $P_M$ is set within the period $P_P$, the energy of ions directed from the plasma to the support 14 is relatively low.

In the method MT5, the substrate is disposed within the chamber 10 over the first period and the second period. The substrate is disposed on the support 14 within the chamber 10. A substrate WD to which the method MT5 is applicable has a base area URE and a film FE as illustrated in FIG. 16A. The film FE is provided on the base area URE. The substrate WE may further have a mask MKE. The mask MKE is provided on the film FE. The mask MKE is patterned so as to partially expose the surface of the film FE. In an example, the base area URE is formed of silicon oxide, the film FE is formed of polycrystalline silicon, and the mask MKC is formed of silicon oxide.

The processing gas used in step ST51 may include a halogen-containing gas such as, for example, $Cl_2$ gas, HBr gas, or $SF_6$ gas. The processing gas used in step ST51 may further include an oxygen-containing gas such as, for example, $O_2$ gas. The processing gas used in step ST52 may include an oxygen-containing gas such as, for example, $O_2$ gas when the processing gas is different from the gas used in step 52. The processing gas used in step ST52 may further include a rare gas such as, for example, argon gas.

In step ST51, the energy of the ions directed from the plasma to the support 14 is relatively high. Accordingly, in step ST51, ions from the plasma are radiated to the film FE, and the film FE is etched by chemical ion etching. As illustrated in FIG. 16B, in step ST51, the film FE is etched to provide a sidewall surface. In step ST52, the energy of the ions directed from the plasma to the support 14 is relatively low. In step ST52, as illustrated in FIG. 16C, the etching of the film FE is suppressed, and the area including the surface of the film FE is modified to form a modified area MR. For example, the modified area MR is formed by oxidation of silicon in the area including the surface of the film FE.

In the following step ST53, it is determined whether a stop condition is satisfied. In step ST53, the stop condition is determined to be satisfied when the number of times of execution of a sequence including step ST51 and step ST52 reaches a predetermined number. Alternatively, in step ST53, the stop condition may be determined based on the light emission intensity of a predetermined wavelength acquired by the light emission analyzer 54, and may be determined based on the execution time length of the sequence including step ST51 and step ST52 or the repetition of the sequence. When it is determined in step ST53 that the stop condition is not satisfied, the sequence including step ST51 and step ST52 is executed again. When it is determined in step ST53 that the stop condition is satisfied, the method MT5 is terminated.

In the method MT5, step ST51 and step ST52 are alternately repeated. That is, in the method MT5, the modifying processing of the film FE (step ST52) and the etching of the film FE (step ST51) are alternately performed. In the method MT5, since the sidewall surface of the film FE is modified, etching of the sidewall surface in step ST51 is suppressed as illustrated in FIG. 16D.

Figure 17:
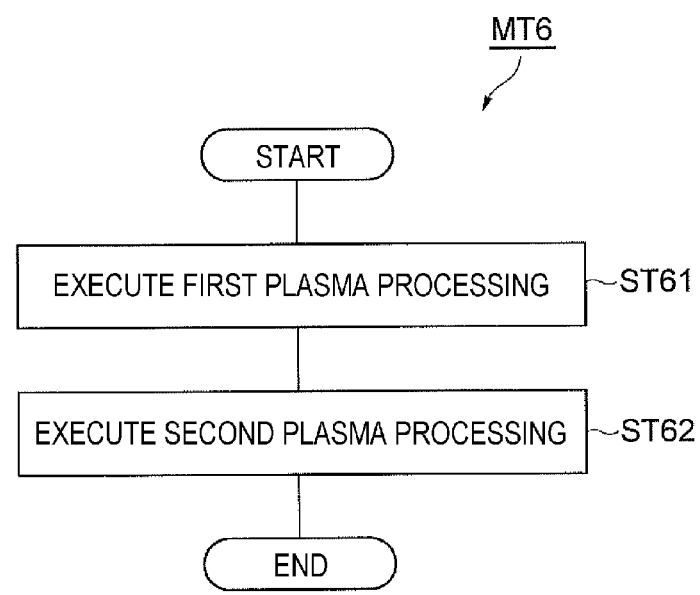
FIG. 17 is a flowchart illustrating a plasma processing method according to still another embodiment.
Figure 18A:
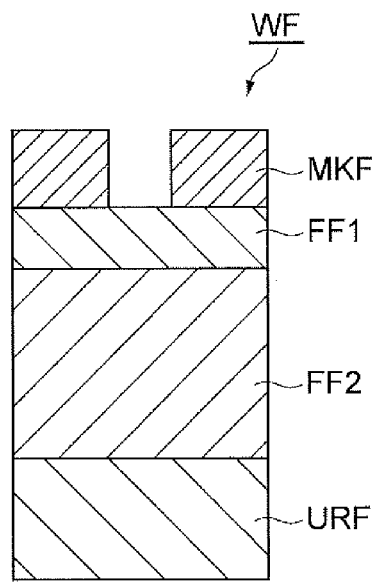
FIG. 18A is a partially enlarged cross-sectional view of an exemplary substrate.
Figure 18B:
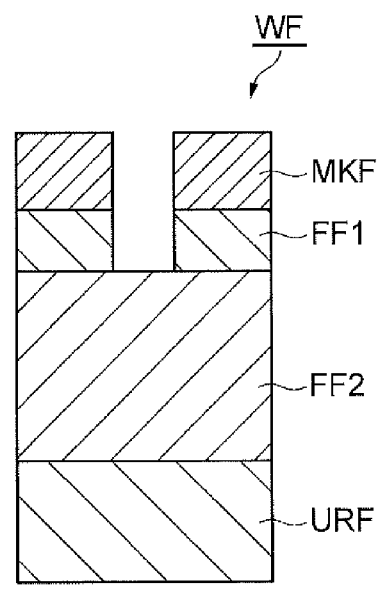
FIGS. 18B and 18C are partially enlarged cross-sectional views illustrating an exemplary substrate after executing a plurality of steps of the plasma processing method illustrated in FIG. 17, respectively.
Figure 18C:
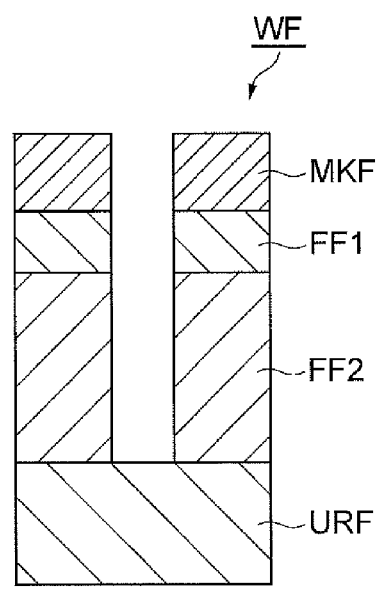

Next, reference is made to FIGS. 17, 18A, 18B, and 18C. FIG. 17 is a flowchart illustrating a plasma processing method according to still another embodiment. FIG. 18A is a partially enlarged cross-sectional view of an exemplary substrate. FIGS. 18B and 18C are partially enlarged cross-sectional views illustrating an exemplary substrate after executing a plurality of steps of the plasma processing method illustrated in FIG. 17, respectively.

The plasma processing method (hereinafter, referred to as "method MT6") illustrated in FIG. 17 includes step ST61 and step ST62. Step ST61 is executed in a first period like step S11 of the method MT1. A first plasma processing is executed in step ST61. Step ST62 is executed in a second period like step S12 of the method MT1. The second period is a period following the first period. A second plasma processing is executed in step ST62.

In step ST61 and step ST62, a processing gas is supplied into the chamber 10. In step ST61 and step ST62, the gas supply section GS is controlled by the control unit 80 to supply the processing gas. In step ST61 and step ST62, the exhaust apparatus 50 is controlled by the control unit 80 to set the pressure within the chamber 10 to a designated pressure. The pressure within the chamber 10 is set to, for example, a pressure in the range of several mTorr to 1000 mTorr.

In each of steps ST61 and ST62, steps ST1 to ST3 are executed. In each of steps ST61 and ST62, the control unit 80 controls the first radio-frequency power supply 61, the second radio-frequency power supply 62, and the second matcher 64 so as to execute steps ST1 to ST3.

In step ST61, the partial period $P_M$ is set within the period $P_N$. In step ST61, the control unit 80 controls the second matcher 64 to set the partial period $P_M$ within the period $P_P$. In step ST62, the partial period $P_M$ is set within the period $P_N$. In step ST62, the control unit 80 controls the second matcher 64 to set the partial period $P_M$ within the period $P_N$.

In step ST61 and step ST62, plasma is formed within the chamber 10. In step ST61, since the partial period $P_M$ is set within the period $P_P$, the energy of ions directed from the plasma to the support 14 is relatively low. Meanwhile, in step ST62, since the partial period $P_M$ is set within the period $P_N$, the energy of ions directed from the plasma to the support 14 is relatively high.

As illustrated in FIG. 18A, a substrate WA to which the method MT6 is applicable has a first film FF1 and a second film FF2. The first film FF1 is provided on the second film FF2. The substrate WF may further include a base area UBF and a mask MKF. The second film FF2 is provided on the base area URF. The mask MKF is provided on the first film FF1. The mask MKF is patterned so as to partially expose the first film FF1. In an example, the base area URF is formed of silicon. The first film FF1 is an antireflection film containing silicon. The second film FF2 is formed of silicon oxide. The mask MKF is formed of a photoresist film.

In the method MT6, the substrate WF is disposed within the chamber 10 over the first period and the second period. The substrate WF is disposed on the support 14 within the chamber 10. The processing gas used in step ST61 and step ST62 may include a fluorocarbon gas such as, for example, $CF_4$ gas. The processing gas used in step 61 and step ST62 may further include a rare gas such as, for example, argon gas.

As illustrated in FIG. 18B, in step ST61, ions from the plasma are radiated to the first film FF1 and the first film FF1 is etched by chemical ion etching so as to expose the second film FB2. When it is determined that the etching amount of the first film FF1 is decreased from the light emission intensity acquired by the light emission analyzer 54, step ST61 is terminated. Alternatively, step ST61 is terminated after the lapse of a predetermined time.

As illustrated in FIG. 18C, in step ST62, ions from the plasma are radiated to the second film FF2 and the second film FF2 is etched by chemical ion etching so as to expose the base area URF. When it is determined that the etching amount of the film FF2 is decreased from the light emission intensity acquired by the light emission analyzer 54, step ST62 is terminated. For example, when it is determined that the light emission intensity of CO acquired by the light emission analyzer 54 is equal to or lower a predetermined value, step ST62 is terminated. Alternatively, step ST62 is terminated after the lapse of a predetermined time.

According to this method MT6, it is possible to etch a multilayer film having a film capable of being etched with relatively lower energy as the first film FF1 and having a film requiring relatively high energy for etching as the second film FF2.

Although various embodiments have been described above, various omissions, substitutions, and changes may be made without being limited thereto. In addition, elements in different embodiments may be combined to form other embodiments.

For example, the plasma processing apparatus in another embodiment may be any type of plasma processing apparatus other than the capacitively coupled plasma processing apparatus. As such a plasma processing apparatus, an inductively coupled plasma processing apparatus and a plasma processing process which uses surface waves such as, for example, microwaves, for plasma generation are exemplified. Even in such plasma processing apparatuses, the impedance of the matching circuit 64a is set such that a reflection from the load of the second radio-frequency power supply 62 is reduced in a partial period $P_M$ in each cycle $P_{LF}$ of the radio-frequency power LF. For example, the variable reactance of a variable reactance element of the matching circuit 64a is adjusted so as to reduce the difference between the impedance $Z_2$ in the partial period $P_M$ and the output impedance of the second radio-frequency power supply 62. In addition, in the inductively coupled plasma processing apparatus, the radio-frequency power HF from the second radio-frequency power supply 62 is supplied to an inductively coupled antenna via the second matcher 64. In the plasma processing apparatus using surface waves such as, for example, microwaves in order to generate plasma, the radio-frequency power HF from the second radio-frequency power supply 62 is supplied to the lower electrode 18 via the second matcher 64.

Figure 19:
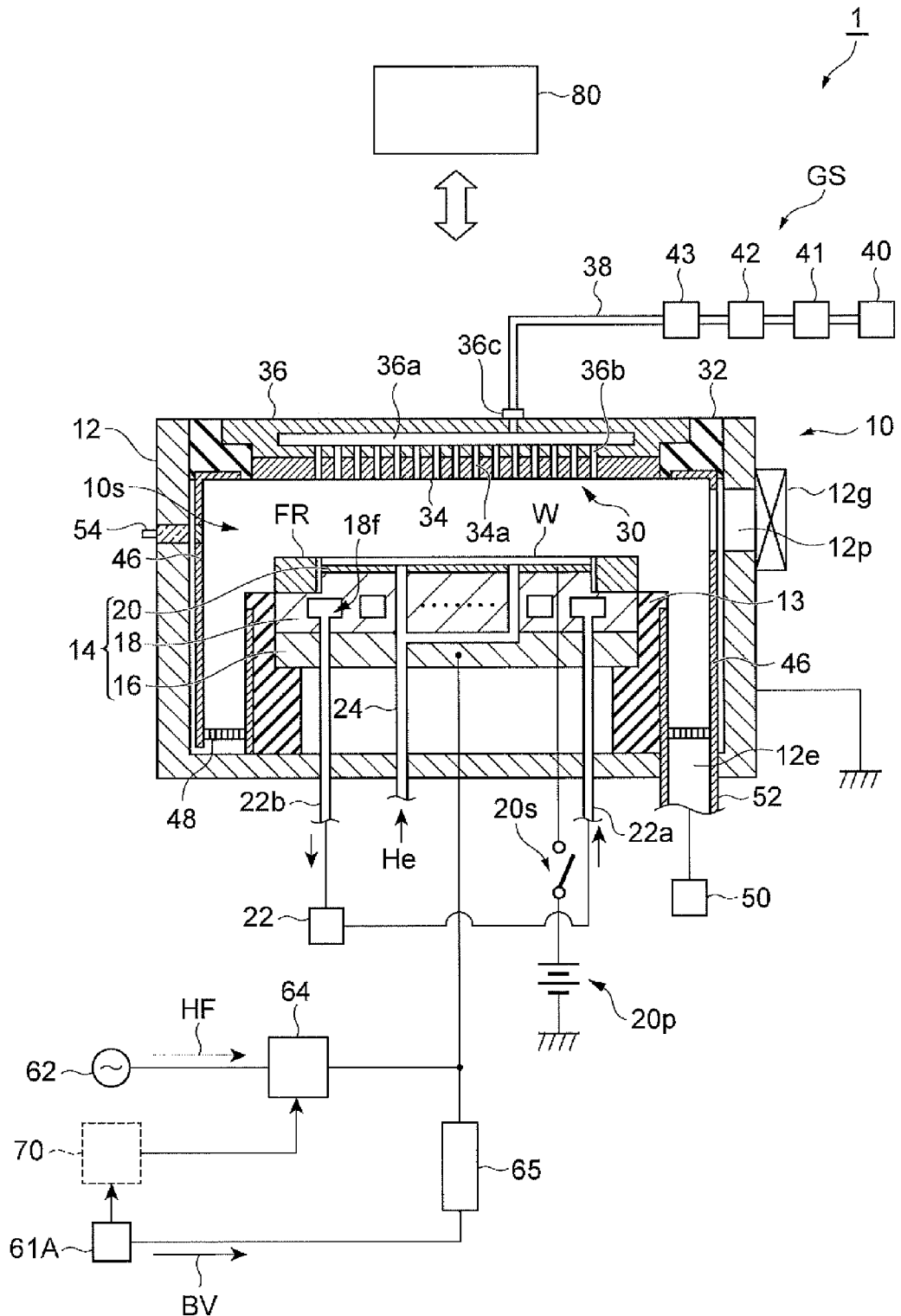
FIG. 19 is a view schematically illustrating a plasma processing apparatus according to another embodiment.

In addition, as illustrated in FIG. 19, the plasma processing apparatus 1 may include a power supply 61A instead of the first radio-frequency power supply 61. FIG. 19 is a view schematically illustrating a plasma processing apparatus according to another embodiment. In the plasma processing apparatus 1 illustrated in FIG. 19, the power supply 61A is electrically connected to a lower electrode 18. The power supply 61A is configured to generate a pulsed negative DC voltage BV.

Figure 20:
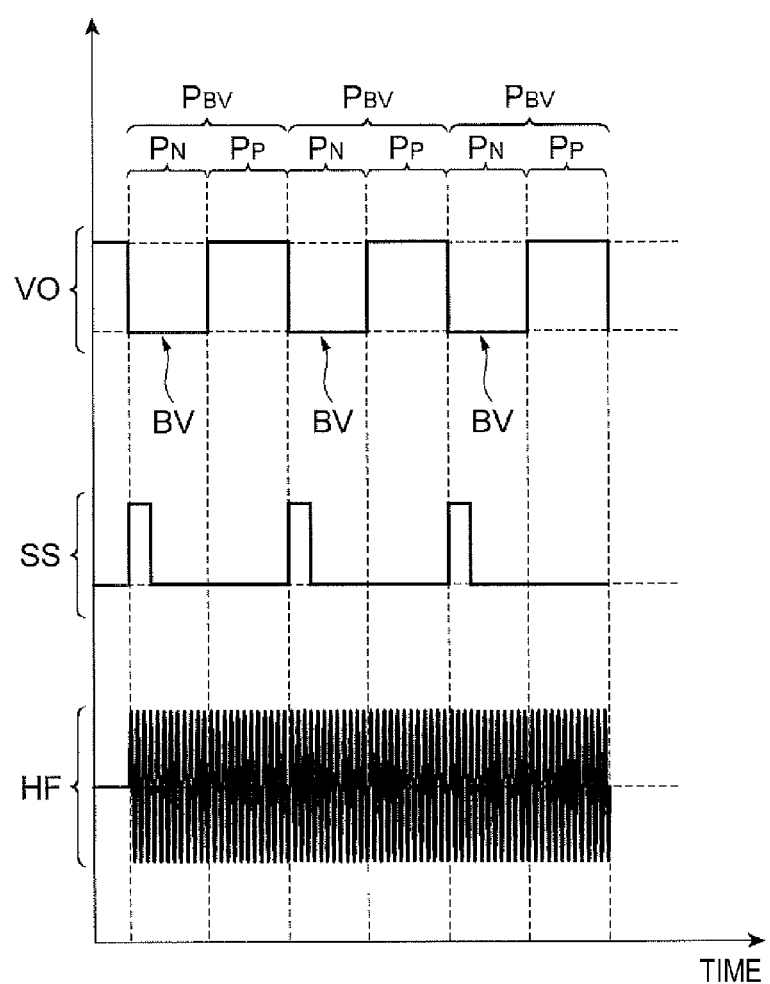
FIG. 20 is an exemplary timing chart illustrating an output voltage VO, a radio-frequency power HF, and a synchronization signal SS of a power supply 61A.

FIG. 20 is an exemplary timing chart illustrating an output voltage VO, a radio-frequency power HF, and a synchronization signal SS of a power supply 61A. As illustrated in FIG. 20, the output voltage VO of the power supply 61A includes a pulsed negative DC voltage generated periodically. That is, the power supply 61A is configured to periodically apply a pulsed negative DC voltage BV to the lower electrode 18. In the example illustrated in FIG. 20, the power supply 61A periodically applies a pulsed negative DC voltage BV to the lower electrode in cycles $P_{BV}$. Each cycle $P_{BV}$ includes a period $P_N$ and a period $P_P$. In each cycle $P_{BV}$, the period $P_P$ is a period after the period $P_N$. In the period $P_N$, the power supply 61A applies a pulsed negative DC voltage BV to the lower electrode 18. In the period $P_P$, the output voltage VO of the power supply 61A may be 0 V. In each cycle $P_{BV}$, the period $P_P$ may be a period before the period $P_N$.

Even in the plasma processing apparatus illustrated in FIG. 19, the controller 64b specifies a partial period PM using a synchronization signal SS. The synchronization signal SS may be a signal having a synchronization pulse at the start time of each cycle $P_{BV}$ of the pulsed negative DC voltage BV. The synchronization signal SS may be generated by the power supply 61A. Alternatively, the synchronization signal SS may be generated by a synchronization signal generator 70. The synchronization signal generator 70 may be configured to receive a signal synchronized with the pulsed negative DC voltage BV and generate a synchronization signal SS from the signal. Alternatively, the synchronization signal SS may be generated by a synchronization signal generator 72. The synchronization signal SS generated by the synchronization signal generator 72 is supplied to the power supply 61A and the controller 64b. In this example, the power supply 61A periodically outputs the pulsed negative DC voltage BV so as to be synchronized with the synchronization signal SS generated by the synchronization signal generator 72.

Even in the plasma processing apparatus illustrated in FIG. 19, one or more partial periods $P_M$ may be set within each cycle $P_{LF}$. In addition, as long as each of the one or more partial periods $P_M$ is a partial period in each cycle $P_{LF}$, the start time and time length are not limited. The start time and time length of the partial period $P_M$ may be arbitrarily set by designation from the control unit 80 described above. In addition, the partial period $P_M$ may be a period within the period $P_N$. Alternatively, the partial period $P_M$ may be with the period $P_P$.

In addition, a plasma processing apparatus used in the method MT, the method MT1, the method MT2, the method MT3, the method MT4, the method MT5, and the method MT6 may be of a type that is different from a capacitively coupled plasma processing apparatus. For example, the above-described inductively coupled plasma processing apparatus or the plasma processing apparatus using surface waves such as microwaves for plasma generation may be used in the method MT, the method MT1, the method MT2, the method MT3, the method MT4, the method MT5, and the method MT6.

According to an embodiment, it is possible to efficiently supply ions having desired ion energy to a substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a chamber;
   a substrate support having a lower electrode and provided within the chamber;
   a first radio-frequency power supply configured to supply first radio-frequency power for bias to the lower electrode;
   a first matcher connected between the first radio-frequency power supply and a load of the first radio-frequency power supply;
   a second radio-frequency power supply configured to supply second radio-frequency power for plasma generation; and
   a second snatcher connected between the second radio-frequency power supply and a load of the second radio-frequency power supply,
   wherein the second matcher includes a matching circuit having a variable impedance and a controller, and
   the controller is configured to set an impedance of the matching circuit such that a reflection from the load of the second radio-frequency power supply is reduced in a partial period designated within each cycle of the first radio-frequency power.

2. The plasma processing apparatus according to claim 1, wherein the partial period is a period within a period in which a voltage of the first radio-frequency power output from the first radio-frequency power supply has a negative polarity.

3. The plasma processing apparatus according to claim 1, wherein the partial period is a period within a period in which a voltage of the first radio-frequency power output from the first radio-frequency power supply has a positive polarity.

4. The plasma processing apparatus according to claim 1, further comprising:
   a sensor configured to measure a voltage and a current in an electrical path between the matching circuit and the second radio-frequency power supply,
   wherein the controller is configured to: determine an impedance of a load side of the second radio-frequency power supply within the partial period from the voltage and the current acquired by the sensor; and set the impedance of the matching circuit such that a difference between the determined impedance and an output impedance of the second radio-frequency power supply is reduced.

5. The plasma processing apparatus according to claim 1, wherein the controller is further configured to:
   execute a first plasma processing in the chamber in a first period; and
   execute a second plasma processing in the chamber in a second period after the first period or following the first period,
   wherein each of the executing the first plasma processing and the executing the second plasma processing includes:
      supplying the first radio-frequency power from the first radio-frequency power supply to the lower electrode via the first matcher;
      supplying the second radio-frequency power from the second radio-frequency power supply via the second matcher; and setting an impedance of a matching circuit of the second matcher such that a reflection from a load of the second radio-frequency power supply is reduced in a partial period designated within each cycle of the first radio-frequency power, wherein; in one of the executing the first plasma processing and the executing the second plasma processing, the partial period is a period within a period in which a voltage of the first radio-frequency power output from the first radio-frequency power supply has a negative polarity, and in a remaining one of the executing the first plasma processing and the executing the second plasma processing, the partial period is a period within a period in which a voltage of the first radio-frequency power output from the first radio-frequency power supply has a positive polarity.

6. The plasma processing apparatus according to claim 5, wherein, in the executing the first plasma processing, the partial period is a period within a period in which the voltage of the first radio-frequency power output from the first radio-frequency power supply has a negative polarity, and in the executing the second plasma processing, the partial period is a period within a period in which the voltage of the first radio-frequency power output from the first radio-frequency power supply has a positive polarity.

7. The plasma processing apparatus according to claim 5, wherein, in the executing the first plasma processing, the partial period is a period within a period in which the voltage of the first radio-frequency power output from the first radio-frequency power supply has a positive polarity, and in the executing the second plasma processing, the partial period is a period within a period in which the voltage of the first radio-frequency power output from the first radio-frequency power supply has a negative polarity.

8. The plasma processing apparatus according to claim 5, wherein a substrate is disposed within the chamber over the first period and the second period, the substrate has a base area and a film provided on the base area, in the executing the first plasma processing, the film is etched using plasma of a processing gas such that the base area is exposed, and in the executing the second plasma processing, the film is further etched using the plasma of the processing gas.

9. The plasma processing apparatus according to claim 5, wherein a substrate is disposed within the chamber over the first period and the second period, the substrate has a first film and a second film, the first film being provided on the second film, in the executing the second plasma processing, the first film is etched using plasma of a processing gas, and in the executing the second plasma processing, the second film is etched using the plasma of the processing gas.

10. The plasma processing apparatus according to claim 7, wherein a substrate is disposed within the chamber in the first period, in the executing the first plasma processing, a film of the substrate is etched using plasma, of a processing gas, the substrate is not disposed within the chamber in the second period, and deposit attached to an inner wall surface of the chamber is removed using the plasma of the processing gas in the executing the second plasma processing.

11. The plasma processing apparatus according to claim 6, wherein a substrate is disposed within the chamber over the first period and the second period, in the executing the first plasma processing, a film of the substrate is etched using plasma of a processing gas such that a film of the substrate provides a sidewall surface, in the executing the second plasma processing, deposit including chemical species from the plasma of the processing gas or chemical species from plasma of a separate processing gas is formed on a surface of the substrate on which the film is etched in the executing the first plasma processing, and the executing the first plasma processing and the executing the second plasma processing are alternately repeated.

12. The plasma processing apparatus according to claim 6, wherein a substrate is disposed within the chamber over the first period and the second period, in the executing the first plasma processing, a film of the substrate is etched using plasma of a processing gas such that a film of the substrate provides a sidewall surface, in the executing the second plasma processing, a surface of the film etched in the executing the first plasma processing is modified using the plasma of the processing gas or plasma of a separate processing gas, and the executing the first plasma processing and the executing the second plasma processing are alternately repeated.

13. An impedance matching method executed in a plasma processing apparatus, the impedance matching method comprising:

supplying first radio-frequency power for bias from a first radio-frequency power supply to a lower electrode of a support provided in a chamber of the plasma processing apparatus via a first matcher;

supplying a second radio-frequency power for plasma generation from a second radio-frequency power supply via a second matcher; and setting an impedance of a matching circuit of the second matcher such that a reflection from a load of the second radio-frequency power supply is reduced in a partial period designated within each cycle of the first radio-frequency power.

14. The impedance matching method according to claim 13, wherein the partial period is a period within a period in which a voltage of the first radio-frequency power output from the first radio-frequency power supply has a negative polarity.

15. The impedance matching method according to claim 13, wherein the partial period is a period within a period in which a voltage of the first radio-frequency power output from the first radio-frequency power supply has a positive polarity.

16. The impedance matching method according to claim 13, wherein an impedance on a load side of the second radio-frequency power supply within the partial period is determined from a voltage and a current in an electrical path between the matching circuit and the second radio-frequency power supply, the voltage and the current being acquired by a sensor, and the impedance of the matching circuit is set such that a difference between the determined impedance and an output impedance of the second radio-frequency power supply is reduced.

* * * * *